US012325815B2

(12) United States Patent
Schmidt et al.

(10) Patent No.: US 12,325,815 B2
(45) Date of Patent: Jun. 10, 2025

(54) PHOSPHOR COMPOSITIONS AND SHORT WAVELENGTH INFRARED EMITTING PCLEDS EMITTING IN THE 1600-2200 NM WAVELENGTH RANGE

(71) Applicant: Lumileds LLC, San Jose, CA (US)

(72) Inventors: Peter Josef Schmidt, Aachen (DE); Thomas Diederich, Aachen (DE)

(73) Assignee: Lumileds LLC, San Jose, CA (US)

( * ) Notice: Subject to any disclaimer, the term of this patent is extended or adjusted under 35 U.S.C. 154(b) by 562 days.

(21) Appl. No.: 17/844,171

(22) Filed: Jun. 20, 2022

(65) Prior Publication Data
US 2023/0064945 A1   Mar. 2, 2023

Related U.S. Application Data

(60) Provisional application No. 63/235,523, filed on Aug. 20, 2021.

(51) Int. Cl.
*H10H 20/82* (2025.01)
*C09K 11/77* (2006.01)
*H10H 20/851* (2025.01)

(52) U.S. Cl.
CPC ..... *C09K 11/7774* (2013.01); *H10H 20/8512* (2025.01)

(58) Field of Classification Search
CPC ........... H10H 20/8512; H10H 20/8242; H10H 20/8252
See application file for complete search history.

(56) References Cited

U.S. PATENT DOCUMENTS 4,969,150 A    11/1990 Esterowitz et al.
8,426,871 B2   4/2013  Rappaport et al.
(Continued)

FOREIGN PATENT DOCUMENTS

CN    101831707 A    9/2010
CN    101831708 A    9/2010
(Continued)

OTHER PUBLICATIONS

From the EPO as the ISA, Notification of the International Search Report and the Written Opinion of the International Searching Authority, or the Declaration, PCT/US2022/034342, Sep. 9, 2022, 9 pages.
(Continued)

*Primary Examiner* — Jaehwan Oh

(57) ABSTRACT

A wavelength converting structure is provided, the wavelength converting structure including an SWIR phosphor having emission wavelengths in the range of 1600-2200 nm, the SWIR phosphor comprising a structurally disordered garnet material, a sensitizer ion, and at least one rare earth emitter ion. Also provided is a luminescent material having emission wavelength in the range of 1600-2200 nm, the luminescent material including $(Gd_{3-u-v-x-y-z}Lu_xTm_yHo_zSc_vRE_u)[Sc_{2-a-b}Lu_aCr_bGa_dAl_e]\{Ga_{3-c}Al_c\}O_{12}$ with RE=La, Y, Yb, Nd, Er, Ce and $0 \leq u \leq 2$, $0 < v \leq 1$, $0 < x \leq 1$, $0 < y \leq 0.5$, $0 \leq z \leq 0.05$, $0 < a \leq 1$, $0 < b \leq 0.3$, $0 \leq c \leq 3$, $0 < d \leq 1.8$, $0 \leq e \leq 1.8$. An IR emitting device including the luminescent material may provide a broad-band emission in the wavelength range of 1600-2200 nm with a continuous emission spectrum over a spectral width of at least 500 nm.

20 Claims, 21 Drawing Sheets

(56) References Cited

U.S. PATENT DOCUMENTS

| | | | |
|---|---|---|---|
| 2017/0218267 A1 | 8/2017 | Zhuang et al. | |
| 2019/0113207 A1* | 4/2019 | Palmer | G02B 5/223 |
| 2021/0095201 A1 | 4/2021 | Schmidt et al. | |
| 2021/0098660 A1 | 4/2021 | Schmidt et al. | |

FOREIGN PATENT DOCUMENTS

| | | |
|---|---|---|
| JP | 2012531043 A | 12/2012 |
| JP | 2017521524 A | 8/2017 |

OTHER PUBLICATIONS

Pan et al., "Disordered Tm3+, Ho3+-codoped CNGG garnet crystal: Towards efficient laser materials for ultrashort pulse generation at ~2 [mu]m", Journal of Alloys and Compounds, Elsevier Sequoia, Lausanne, CH, vol. 853, Sep. 13, 2020, XP086326530, 15 pages.
Toncelli et al., NIR luminescence and laser parameters of Ca3Sc2G3c(12 garnet host crystals activated with Tm3+ and Ho3+, Journal of Luminescence, US 2001, No. 92, 8 pages.

* cited by examiner

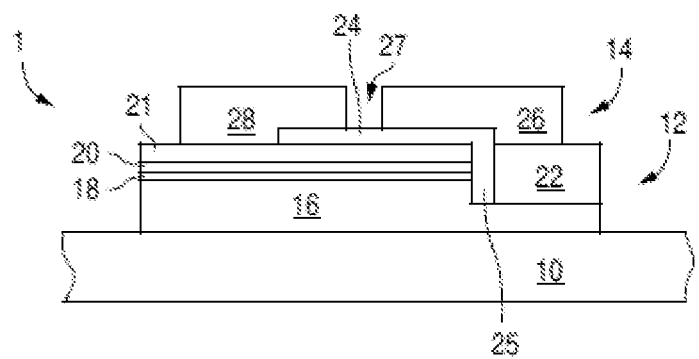
FIG. 3
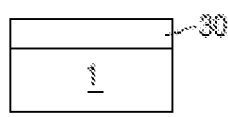
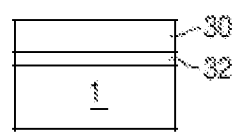
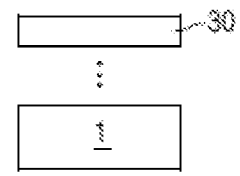
FIG. 4  FIG. 5  FIG. 6

1400

1800

1900

1910    1920

2300

PHOSPHOR COMPOSITIONS AND SHORT WAVELENGTH INFRARED EMITTING PCLEDS EMITTING IN THE 1600-2200 NM WAVELENGTH RANGE

CROSS-REFERENCE TO RELATED APPLICATION

This application claims priority of U.S. Application No. 63/235,523 titled "Phosphor Composition and Short Wavelength Infrared Emitting PCLEDS Emitting in the 1600-2200 NM Wavelength Range," filed Aug. 20, 2021 and incorporated herein by reference in its entirety.

FIELD OF THE INVENTION

The disclosure relates generally to phosphor compositions for use in phosphor-converted light-emitting devices, and more particularly to phosphor compositions having broadband infrared emission in the 1600-2200 nm wavelength range.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, light having a desired color temperature and desired color-rendering properties.

SUMMARY

In one aspect, a wavelength converting structure is provided, the wavelength converting structure including an SWIR phosphor having emission wavelengths in the range of 1600-2200 nm, the SWIR phosphor comprising a structurally disordered garnet material, a sensitizer ion, and at least one rare earth emitter ion. The structurally disordered garnet material may include compositions derived from the structurally ordered gadolinium gallium garnet $(Gd_3)[Ga_2]\{Ga_3\}O_{12}$ with 8-fold coordinated Gd atoms, 6-fold coordinated Ga atoms, and 4-fold coordinated Ga atoms. The structurally disordered garnet material may include atoms that can occupy more than one lattice site. Gadolinium may be partially replaced by at least one of a rare earth element chosen from the group including Tm, Ho, La, Y, Yb, Nd, Er, and Ce. The rare earth emitter element may be a combination of Tm and Ho. The rare earth emitter element may be Tm. The SWIR phosphor may include $(Gd_{3-u-v-x-y-z}Lu_xTm_y Ho_zSc_vRE_u)[Sc_{2-a-b-d-e}Lu_aCr_bGa_dAl_e]\{Ga_{3-c}Al_c\}O_{12}$ with RE=La, Y, Yb, Nd, Er, Ce and $0 \le u \le 2$, $0 < v \le 1$, $0 < x \le 1$, $0 < y \le 0.5$, $0 \le z \le 0.05$, $0 < a \le 1$, $0 < b \le 0.3$, $0 \le c \le 3$, $0 < d \le 1.8$, $0 \le e \le 1.8$. The non-doped host lattice of the SWIR phosphor may include $(Gd,Lu,Sc)_3[Sc,Lu,Ga,Al])_2\{Ga,Al\}_3O_{12}$ crystallizing in the structurally disordered cubic garnet structure type. The SWIR phosphor may include at least one of $Gd_{2.367}Ho_{0.01}Tm_{0.152}Sc_{1.6}Lu_{0.27}Ga_{1.8}Al_{1.78}Cr_{0.04}O_{12}$, $Gd_{2.59}Tm_{0.24}Ho_{0.02}Sc_{0.75}Lu_{0.3}Ga_2Al_2Cr_{0.1}O_{12}$, $Gd_2Ho_{0.013}Tm_{0.2}Sc_{0.67}Lu_{0.24}Ga_{1.6}Al_{3.2}Cr_{0.08}O_{12}$ and $Gd_{2.67}Ho_{0.01}Tm_{0.17}Sc_{1.8}Lu_{0.3}Ga_2AlCr_{0.05}O_{12}$. The wavelength converting structure may further include an additional IR phosphor having emission in the wavelength range of 1100-1700 nm. The additional IR phosphor may include one or more of $Ni^{2+}$, or $Ni^{2+}$ and $Cr^{3+}$ doped spinel, perovskite, and garnet type IR phosphor emitting in the 1000-1700 nm range. An example is a $Ni^{2+}$ and $Cr^{3+}$ doped garnet phosphor of composition $(Gd)_3[Sc, Ga, Ni, Zr, Cr]_2\{Ga,Al\}_3O_{12}$ for example $Gd_3Ga_{3.7}ScAl_{0.18}Ni_{0.02}Zr_{0.021}Cr_{0.1}O_{12}$ and $Gd_3Ga_{4.7}Al_{0.18}Ni_{0.02}Zr_{0.021}Cr_{0.1}O_{12}$.

In another aspect, a luminescent material that emits lighting having emissions wavelengths in the range of 1600-2200 nm is provided, the luminescent material includes a structurally disordered garnet material doped with at least one sensitizer ion and at least one rare earth emitter ion. The structurally disordered garnet material may include compositions derived from the structurally ordered gadolinium gallium garnet $(Gd_3)[Ga_2]\{Ga_3\}O_{12}$ with three 8-fold coordinated Gd atoms, two 6-fold coordinated Ga atoms, and three 4-fold coordinated Ga atoms. The structurally disordered garnet material may include atoms that can occupy more than one lattice site. Gadolinium may be partially replaced by at least one of a rare earth element chosen from the group including at least one of Tm, Ho, La, Y, Yb, Nd, Er, and Ce. The rare earth emitter ion may be a combination of Tm and Ho. The rare earth emitter ion may be Tm. The SWIR phosphor may include $(Gd_{3-u-v-x-y-z}Lu_xTm_y Ho_zSc_vRE_u)[Sc_{2-a-b-d-e}Lu_aCr_bGa_dAl_e]\{Ga_{3-c}Al_c\}O_{12}$ with RE=La, Y, Yb, Nd, Er, Ce and $0 \le u \le 2$, $0 < v \le 1$, $0 < x \le 1$, $0 < y \le 0.5$, $0 \le z \le 0.05$, $0 < a \le 1$, $0 < b \le 0.3$, $0 \le c \le 3$, $0 < d \le 1.8$, $0 \le e \le 1.8$. The SWIR phosphor may include $(Gd,Lu)_3(Sc, Lu)_2 (Ga,Al)_3$ crystallizing in the structurally disordered cubic garnet structure type. The SWIR phosphor may include at least one of $Gd_{2.367}Ho_{0.01}Tm_{0.152}Sc_{1.6}Lu_{0.27}Ga_{1.8}Al_{1.78}Cr_{0.04}O_{12}$, $Gd_{2.59}Tm_{0.24}Ho_{0.02}Sc_{0.75}Lu_{0.3}Ga_2Al_2Cr_{0.1}O_{12}$, $Gd_2Ho_{0.013}Tm_{0.2}Sc_{0.67}Lu_{0.24}Ga_{1.6}Al_{3.2}Cr_{0.08}O_{12}$ and $Gd_{2.67}Ho_{0.01}Tm_{0.17}Sc_{1.8}Lu_{0.3}Ga_2AlCr_{0.05}O_{12}$.

In yet another aspect, an IR emitting device is provided, the IR emitting device including a wavelength converting structure, the wavelength converting structure including an SWIR phosphor having emission over a wavelength range of 1600-2200 nm with a continuous emission spectrum over a spectral width of at least 500 nm, and a light source configured to emit primary light into the wavelength converting structure. The SWIR phosphor may include $(Gd_{3-u-v-x-y-z}Lu_xTm_yHo_zSc_vRE_u)[Sc_{2-a-b-d-e}Lu_a$ $Cr_bGa_dAl_e]\{Ga_{3-c}Al_c\}O_{12}$ with RE=La, Y, Yb, Nd, Er, Ce and $0 \leq u \leq 2$, $0<v \leq 1$, $0<x \leq 1$, $0<y \leq 0.5$, $0 \leq z \leq 0.05$, $0<a \leq 1$, $0<b \leq 0.3$, $0 \leq c \leq 3$, $0<d \leq 1.8$, $0 \leq e \leq 1.8$.

BRIEF DESCRIPTION OF THE DRAWINGS

FIG. 3 is a cross-section view of one example of an LED.

FIG. 4 is a cross sectional view of an IR emitting device with a wavelength converting structure in direct contact with an LED.

FIG. 5 is a cross sectional view of an IR emitting device with a wavelength converting structure in close proximity to an LED.

FIG. 6 is a cross sectional view of an IR emitting device with a wavelength converting structure spaced apart from an LED.

DETAILED DESCRIPTION

Figure 1:
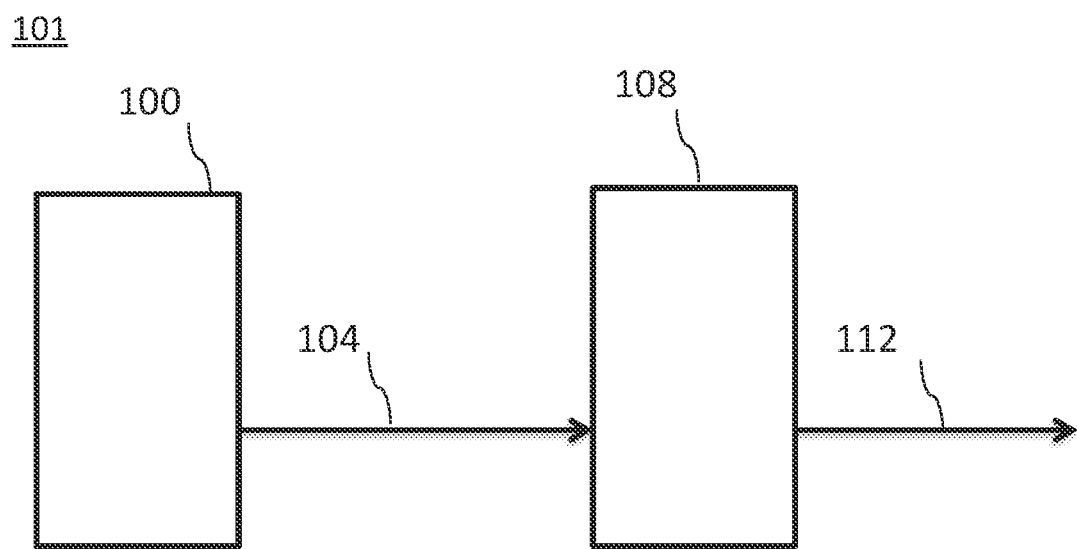
FIG. 1 illustrates an embodiment of a wavelength converting structure as part of an infrared light-emitting device.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

This specification discloses phosphors that can emit infrared ("IR") radiation in the short wavelength infrared radiation range ("SWIR"), more specifically, SWIR phosphors that can emit infrared radiation having a peak wavelength in a range of 1600 nm to 2200 nm. In particular, the SWIR phosphors disclosed herein are capable of providing a continuous emission spectrum, without emission gaps, while maintaining a high conversion efficiency, in the range of 1600 nm to 2200 nm. For example, SWIR phosphors disclosed herein may provide a continuous emission spectrum over a spectral width of at least 500 nm, and have a minimum spectral power in the 1600 nm to 2200 nm emission range that is at least 20% of the median spectral power in this range.

SWIR phosphors disclosed herein may be excited by light with wavelengths in the blue spectral range. The broad-band SWIR phosphor materials can efficiently convert shorter wavelength blue light into broad-band emission with longer SWIR wavelengths. For economy of language, infrared radiation may be referred to herein as "infrared light," "IR light," or "light."

The specification also discloses light sources that include the SWIR phosphor disclosed herein. Such light sources may include a primary light source, such as an LED, and a wavelength converting structure that includes an SWIR phosphor that emits wavelengths in the 1600-2200 nm range as disclosed herein, to form, for example, an SWIR pcLED. Use of broad-band SWIR phosphors in such light sources may extend the wavelengths emitted by the light source to up to 2200 nm, while providing a continuous spectral power distribution over a wide wavelength range and maintaining a high conversion efficiency.

The wavelength converting structure in the light source may further include additional phosphors. The additional phosphor may include, for example, other SWIR phosphors that emit wavelengths in other portions of the infrared wavelength range, for example, into the 1000-1700 nm spectral range. The additional phosphors may also allow for more efficient excitation of the SWIR phosphors.

This specification also discloses wavelength converting structure devices that includes such broad-band SWIR phosphors. The wavelength converting structure devices having the broad-band SWIR phosphors may further include additional phosphors.

The specification also discloses use of light emitting devices having the broad-band SWIR phosphor in a spectrometer device used for IR absorption spectroscopy applications, where the light emitting devices having an SWIR phosphor, such as an SWIR pcLED as disclosed herein, is used instead of traditional incandescent light sources, such as tungsten filament lamps. Currently, tungsten filament light sources that have a CCT in the range of 2300K are being used to cover the spectral range needed for SWIR spectrometer systems (e.g., 1000 nm to 3000 µm). The tungsten filament light sources, however, lack the mechanical robustness, fast modulating capabilities to increase spectrometer sensitivity, and compactness that is required for, for example, IR absorption spectroscopy integration into small hand held devices, and wearable devices or smartphones. The SWIR phosphors disclosed herein combine the broadened emission bands as preferred for spectroscopy applications with the high conversion efficiency, which means that they require less power, and can be used in miniaturized devices, such as wearable devices.

Certain applications for such SWIR pcLEDs can also be found in the medical field, i.e., in sensors and in endoscopic hyper- or multispectral imaging of tissue where efficient, high intensity light sources are especially needed (see for example: Hayashi et al., A broadband LED source in visible to shortwave-infrared wavelengths for spectral tumor diagnostics, Appl. Phys. Lett. 110, 233701 (2017)). Other uses, include, for example, detecting and sensing polymers that differ in their macromolecular composition, which can easily be identified by their unique IR absorption patterns, and also hyperspectral imaging applications.

The disclosed light sources are efficient and allow further miniaturization and cost reduction of spectrometers systems, sensors, and hyper- or multispectral imaging systems that cover the 1600-2200 nm wavelength range, as well as the 1000 nm to 2200 nm range.

SWIR Phosphor Compositions

SWIR phosphor compounds disclosed herein include (i) a structurally disordered garnet host lattice material; (ii) at least one sensitizer ion; and (iii) at least one rare earth emitter ion.

A structurally disordered garnet host lattice material is a garnet lattice that has multiple chemically different doping sites. The disordered structure of the garnet lattice provides a multinary host that broadens the emission bands of the rare earth emitter ion dopant, resulting in a broad-band emission spectrum, but also maintains enough crystalline structure to provide high conversion efficiency. As used herein, the term "structurally disordered" refers to a material that possesses an ordered average structure or long-range translational periodicity that can be, e.g., characterized with an X-ray diffraction experiment. The different crystallographic lattice sites are however populated by chemically different atom species in a non-ordered but more statistical way, leading to a large variety of chemically slightly different substitutional lattice sites for the sensitizer and emitter ions, and thus to inhomogeneously broadened spectral features which is highly desired for the application of the SWIR phosphors. The host lattice has a substantial influence on the optical properties of a dopant, and variations of its chemical surroundings cause variations in the crystal fields at the dopant site, which can result in inhomogeneous, and hence, broader, emission. Therefore, use of a structurally disordered garnet host lattice as disclosed herein can help provide a more continuous emissions spectrum. At the same time, use of a host lattice that is too disordered may cause a drop in conversion efficiency due to, e.g., high concentrations of optically active lattice defects. In particular, the wanted broadening effect here for Cr3+ sensitized converters is realized by relatively high amounts of added elements like Lu, Sc and Al into the garnet material Structurally disordered garnet host lattice compositions used herein may be derived from gadolinium gallium garnet $Gd_3Ga_2Ga_3O_{12}$ with three 8-fold coordinated Gd atoms, two 6-fold coordinated Ga atoms, and three 4-fold coordinated Ga atoms. Example host lattice compositions may include atoms that can occupy more than one lattice site, such as, for example, Lu and Sc (which have possible 8- and 6-fold coordination) and Al (which has possible 6- and 4-fold coordination). The disorder is caused by a statistical distribution of one sort of element over various lattice sites of the garnet structure. For example, Lutetium or Scandium may occupy the 8-fold and 6-fold coordinated lattice sites while Gallium and Aluminum can occupy the 6-fold and 4-fold coordinated lattice sites in concentrations that exceed that of trace or defect levels (>1 atom %). If the host lattice is further being doped with, e.g., Chromium(III) and Thulium according to $(Gd,Lu,Sc,Tm)_3[Sc,Lu,Ga,Al,Cr]_2\{Ga,Al\}_3O_{12}$, these dopants occupy multiple chemically different 6-fold or 8-fold coordinated sites respectively caused by the statistical distribution of the multiple site occupying host lattice elements. As a consequence, this disorder may lead to the desired broadening of e.g. absorption and emission transitions of Chromium(III) and Thulium, respectively. The mixed occupation of the sites lead to multiple different emitting sites in terms of oxygen ligand charge and distance and/or coordination geometry. Such structurally disordered structures lead to a broadening of composed emission bands and thus to a more even distribution of the spectral power over the desired range.

An example of a structurally disordered garnet host lattice is $(Gd,Lu,Sc)_3(Sc,Lu,Ga)_2(Ga,Al)_3O_{12}$ crystallizing in the cubic garnet structure type. In this example the composition of the binary oxides forming the garnet phase is chosen as such that lutetium is incorporated on the 8-fold and 6-fold coordinated cation sites. Alternatively, another example of a structurally disordered host lattice is $(Gd,Lu,Sc)_3Sc_2(Ga,Al)_3 O_{12}$, which also crystallizes in the cubic garnet structure type, and has Sc atoms on both 8-fold and 6-fold coordinated sites.

SWIR phosphors disclosed herein are doped with at least one sensitizer ion. The sensitizer ion efficiently absorbs blue or red pump light, for instance from an LED, and transfers the absorbed energy to rare earth emitter ions that eventually emit in the desired spectral ranges. To efficiently absorb excitation light from a primary LED light source in the blue or red spectral range, the host material may be doped for example with Cr(III) as the sensitizer ion on the 6-fold coordinated sites.

SWIR phosphors disclosed herein are doped with at least one rare earth emitter ion, or a combination of rare earth emitter ions, that provide emission in the desired spectral range. For example, an SWIR phosphor that provides emission in the 1600-2200 nm wavelength range may have the 8-fold coordinated sites doped with Tm(III) and Ho(III) or with Tm(III) only. In addition, the host lattice can be doped with Er(III) to extend the emission range towards ~1500 nm. The excitation and emission properties can be further tuned by replacing an additional part of Gd by La, Y, Yb, Nd, or Ce.

SWIR phosphors disclosed herein may have compositions that include phosphors from the class of garnet materials having a composition of: $(Gd_{3-u-v-x-y-z}Lu_xTm_yHo_zSc_vRE_u)[Sc_{2-a-b-d-e}Lu_aCr_bGa_dAl_e]\{Ga_{3-c}Al_c\}O_{12}$ with RE=La, Y, Yb, Nd, Er, Ce and $0 \leq u \leq 2$, $0 < v \leq 1$, $0 < x \leq 1$, $0 \leq y \leq 0.5$, $0 \leq z \leq 0.05$, $0 \leq a \leq 1$, $0 < b \leq 0.3$, $0 \leq c \leq 3$, $0 < d \leq 1.8$, $0 \leq e \leq 1.8$. Examples of SWIR phosphor having compositions in this class of garnet materials are described in more detail below, and include $Gd_{2.367}Ho_{0.01}Tm_{0.152}Sc_{1.6}Lu_{0.27}Ga_{1.8}Al_{1.78}Cr_{0.04}O_{12}$, $Gd_{2.59}Tm_{0.24}Ho_{0.02}Sc_{0.75}Lu_{0.3}Ga_2Al_2Cr_{0.1}O_{12}$, $Gd_2Ho_{0.013}Tm_{0.2}Sc_{0.67}Lu_{0.24}Ga_{1.6}Al_{3.2}Cr_{0.08}O_{12}$, and $Gd_{2.67}Ho_{0.01}Tm_{0.17}Sc_{1.8}Lu_{0.3}Ga_2AlCr_{0.05}O_{12}$.

To enhance the crystal quality of the SWIR phosphors, fluxing agents such as fluorides can be applied during manufacturing of the SWIR phosphor compositions, e.g., powder phosphor processing, which may result in elements from such fluxing agents being incorporated into the SWIR composition. An example of a flux system useful for the SWIR phosphor compositions is gadolinium fluoride. The application of fluoride fluxes may lead to the incorporation of some fluoride ions in the final SWIR phosphor composition without deteriorating its desired properties. An alternative flux system may be, for example, barium fluoride, $BaF_2$, or $AlF_3$ hydrate. Other example flux systems that may be applied include, for example silicon oxide, which may be useful in the manufacturing of ceramic phosphor wavelength converting structures, described in more detail below, that may be characterized as being polycrystalline, sintered luminescence converter elements that include the SWIR phosphors disclosed herein at least as part of the polycrystalline matrix. The silica fluxing agent may be added as fine silica powder or e.g. in form of a precursor such as an alkoxide like tetraethylorthosilicate that is being hydrolyzed during processing. Other parts of the polycrystalline matrix may be e.g. oxides such as aluminum oxide $Al_2O_3$ or mixed oxides like $(Al,Ga)_2O_3$.

Other compounds may be added to the SWIR phosphor composition if the amounts added are low enough so that the desired properties of the resulting SWIR phosphor are not greatly deteriorated but may lead to benefits like improved crystallization speed or better densification. Examples for such other compounds are, for example: alkaline earth compounds such as MgO, CaO or SrO, or the respective carbonates, zirconium or hafnium oxide, niobium or tantalum oxide, germanium oxide, silicon dioxide or other rare earth oxides not explicitly mentioned in the list above.

IR Light Emitting Devices Having Wavelength Converting Structures Emitting Over the 1600-2200 nm Wavelength Range FIG. 1 illustrates an embodiment of an IR light emitting device that emits IR light over the 1600-2200 nm wavelength range. The IR light emitting device 101 includes a wavelength converting structure 108. Wavelength converting structure 108 includes at least one of the disclosed SWIR phosphors that emit in the 1600-2200 nm wavelength range. In addition to wavelength converting structure 108, illumination device 101 includes primary light source 100. The primary light source 100 may be an LED or any other suitable source including, as examples, resonant cavity light emitting diodes (RCLEDs) and vertical cavity laser diodes (VCSELs). For example, primary light source 100 may be a blue light emitting LED, or may include a red light emitting LED. Primary light source 100 emits a first light 104. A portion of the first light 104 is incident upon wavelength converting structure 108. The wavelength converting structure 108 absorbs the first light 104 and emits second light 112. The wavelength converting structure 108 may be structured such that little or no first light is part of the final emission spectrum from the device, though this is not required.

Wavelength converting structure 108 may include, for example, any of the SWIR phosphors disclosed here, such SWIR phosphors including a structurally disordered garnet host lattice, at least one sensitizer ion, and at least one rare earth emitter ion. For example, wavelength converting structure 108 may include an SWIR phosphor including a structurally disordered garnet host lattice, and Cr(III) sensitizer ion, and Tm(III) and Ho(III) rare earth emitter ions. For example, the wavelength converting structure 108 may include an SWIR phosphor from a class of garnet materials having a composition of: $(Gd_{3-u-v-x-y-z}Lu_xTm_yHo_zSc_vRE_u)[Sc_{2-a-b-d-e}Lu_aCr_bGa_dAl_e]\{Ga_{3-c}Al_c\}O_{12}$ with RE=La, Y, Yb, Nd, Er, Ce and $0 \leq u \leq 2$, $0 < v \leq 1$, $0 < x \leq 1$, $0 < y \leq 0.5$, $0 \leq z \leq 0.05$, $0 < a \leq 1$, $0 < b \leq 0.3$, $0 \leq c \leq 3$, $0 < d \leq 1.8$, $0 \leq e \leq 1.8$.

The wavelength converting structure 108 may include an SWIR phosphor that can be excited, for example, in the blue spectral range. For example, light source 100 may be an AlInGaN and/or an InGaN type emitter, and may emit first light 104 in the 440-460 nm wavelength range. The light source 100 may also be a light source that emit first light 104 in the red spectral range, for example, light source 100 may be an AlInGaP type emitter emitting wavelengths in the 600-650 nm wavelength range, or may be an InGaAs type emitter emitting wavelengths in the 700-1000 nm range, however, these red light emitting light sources may be less efficient at exciting the SWIR phosphor than light sources that emit in the blue wavelength range.

Figure 2:
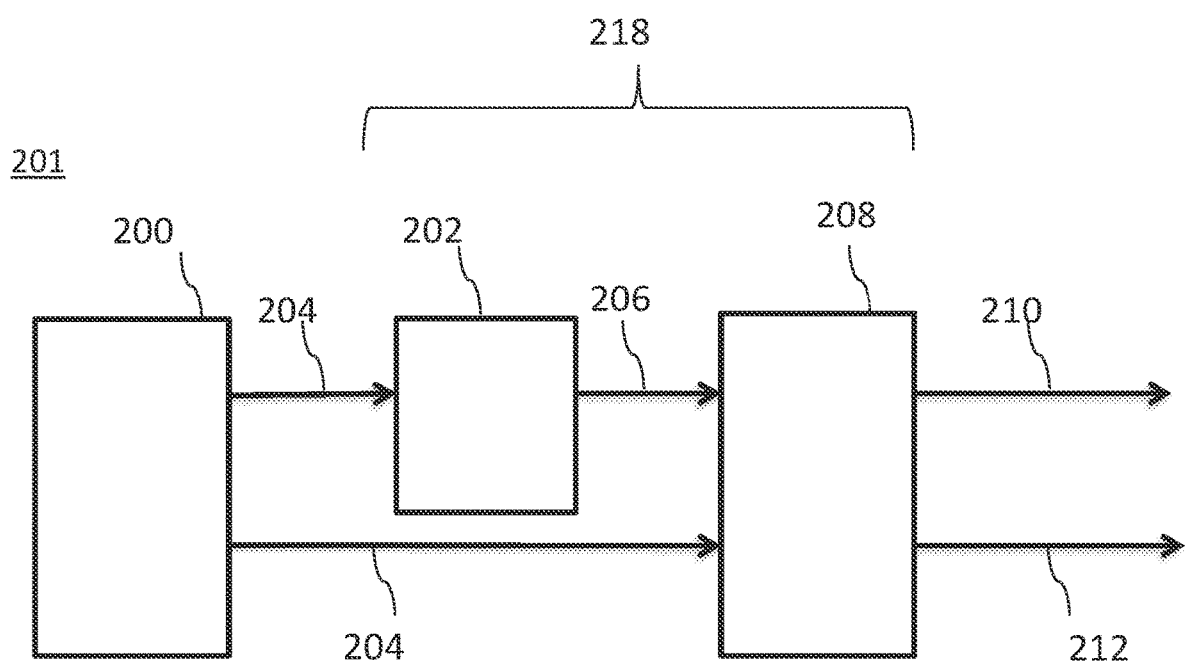
FIG. 2 illustrates another embodiment of a wavelength converting structure as part of an infrared light-emitting device.

To improve the conversion efficiency of the SWIR phosphor included in wavelength converting structure 108, an additional phosphor, such as red emitting phosphor that can be excited by a blue emitting primary LED light source, may be included. FIG. 2 illustrates an IR light emitting device 201 in which a wavelength converting structure including one or more of the disclosed SWIR phosphor materials may further be combined with a second phosphor system. In FIG. 2, the wavelength converting structure 218 includes an SWIR phosphor portion 208 including the SWIR phosphors emitting in the 1600-2200 nm range as disclosed herein, and a second phosphor portion 202, as part of IR light-emitting device 201. In FIG. 2, a light source 200 may be an LED or any other suitable source, (including as examples resonant cavity light emitting diodes (RCLEDs) and vertical cavity laser diodes (VCSELs). Light source 200 emits first light 204.

First light 204 is incident upon wavelength converting structure 218, which includes an SWIR phosphor portion 208 including one or more of the SWIR phosphors disclosed herein, and a second phosphor system 202. A portion of the first light 204 is incident on a second phosphor portion 202 of the wavelength converting structure 218. The second phosphor 202 absorbs the first light 204 and emits third light 206. The third light 206 may have a wavelength range that is within the excitation range of the SWIR phosphor in the SWIR phosphor portion 208 of the wavelength converting structure 218. The third light 206 is incident on the SWIR phosphor portion 208. The SWIR phosphor portion 208 absorbs all or a portion of the third light 206 and emits fourth light 210. Additionally, a portion of the first light 204 may be incident on an SWIR phosphor portion 208 of the wavelength converting structure 218. The SWIR phosphor portion 208 may absorb the first light 204 and emit second light 212, or first light 204 may pass through the SWIR phosphor portion 208.

The wavelength converting structure 218 including an SWIR phosphor 208 and second phosphor 202 may be structured such that little or no first light or third light is part of the final emission spectrum from the device, though this is not required.

Examples of such a second phosphor system which may be useful for use in IR light-emitting device 201 include those disclosed in U.S. patent application Ser. No. 16/393, 428 filed Sep. 13, 2018 and titled "Infrared Emitting Device" and incorporated herein by reference in its entirety. In particular, second phosphor 202 may be, for example, an $Eu^{2+}$ doped red emitting material such as BSSNE type phosphors of composition $M_{2-x}Si_{5-y}Al_yO_yN_{8-y}:Eu_x$ (M=Ba, Sr, Ca), such as, for example $Ba_{0.2}Ca_{0.06}Sr_{1.64}Si_{4.98}Al_{0.020}O_{0.02}N_{7.98}:Eu_{0.1}$; CASN or SCASN type phosphors of composition $M_{1-x}SiAlN_3:Eu_x$ (M=Sr, Ca) such as, for example $Ca_{0.985}SiAlN_3:Eu_{0.015}$; or $M_{1-x}LiAl_3N_4:Eu_x$ (M=Ba, Sr, Ca) such as, for example, $(Ba_{0.5}Ca_{0.5})_{0.995}LiAl_3N_4:Eu_{0.005}$; or $M_{1-x}Li_2Al_{2-y}Si_yO_{2-y}N_{2+y}:Eu_x$ (M=Ba, Sr, Ca) such as, for example, $Sr_{0.996}Li_2Al_{1.996}Si_{0.004}O_{1.996}N_{2.004}:Eu_{0.004}$ which may crystallize in an ordered structure variant of the $UCr_4C_4$ structure type with Ba and Ca occupying specific lattice sites. Similar ordered variants are known for oxides like $RbNaLi_6Si_2O_8$. In $(Ba_{0.5}Ca_{0.5})_{1-x}LiAl_3N_4:Eu_x$ narrow band emission at ~630 nm is obtained for Eu on Ba sites while NIR emission at wavelengths >700 nm is obtained for Eu on Ca sites. In other example, second phosphor 202 may be a CASN type phosphor of composition $Ca_{0.985}SiAlN:Eu_{0.015}$. CASN type red emitting phosphors are commercially available from e.g. Mitsubishi Chemical (BR-101 series).

The SWIR phosphor disclosed herein can be further combined with dielectric coating structures, for example by using an alternating $SiO_2$ and $Nb_2O_5$ layers having thicknesses in the range of 40 nm-140 nm. A dichroic coating that reflects primary pump LED light and transmits the phosphor emitted light in the SWIR range can be a useful solution to enhance the performance of the IR light emitting devices. That is, such a dichroic coating may back-reflect blue light that then gets a chance to be reabsorbed by the wavelength converting structure, without changing the emission spectrum provided by the SWIR phosphor.

In FIG. 2, although the wavelength converting structure 218 is shown with the SWIR phosphor 208 and second phosphor system 202 as two separated blocks, in other embodiments, the wavelength converting structure the SWIR phosphor 208 and second phosphor system 202 may be combined or mixed. Methods of forming wavelength converting structures 108 and 218 are described in more detail below.

IR Light Emitting Devices Having Wavelength Converting Structures Emitting Over the 1100-2200 nm Wavelength Range The SWIR phosphors disclosed herein can be further combined with additional IR phosphors to widen the wavelength range of IR emission emitted from the IR light emitting device. For example, the SWIR phosphors disclosed herein may be combined with additional IR phosphors that emit IR light at shorter wavelengths below the 1600-2200 nm wavelength range of the SWIR phosphors disclosed herein, to expand the wavelength range of light emitted by the IR light emitting device into shorter wavelengths.

Referring again to FIG. 1, the wavelength converting structure 108 may include, for example, the SWIR phosphors disclosed herein and additional IR phosphors. Primary light source 100 emits a first light 104. A portion of the first light 104 is incident upon wavelength converting structure 108 that includes, in this example, one or more additional IR phosphor in addition to the one or more SWIR phosphors disclosed herein. The wavelength converting structure 108 absorbs the first light 104 and emits second light 112. Because the wavelength converting structure 108 includes both the SWIR phosphor and the additional IR phosphor, the second light 112 emits IR light over a wide wavelength range that includes that of the additional IR phosphor as well as the SWIR phosphor 1600-2200 nm disclosed herein.

In one example, the additional IR phosphors included are shorter wavelength IR emitting phosphors disclosed in U.S. patent application Ser. No. 17/035,233, filed Sep. 23, 2020, titled "SWIR pcLED and Phosphor Emitting in the 1100-1700 nm Range," incorporated herein by reference in its entirety. In particular, the additional IR phosphor may be one or more $Ni^{2+}$, or $Ni^{2+}$ and $Cr^{3+}$ doped spinel, perovskite, and garnet type IR phosphor emitting in the 1000-1700 nm range. For example, the additional IR phosphor may include $Li_{0.5-0.5x}(Ga, Sc)_{2.5-0.5x-y}O_4:Ni_x,Cr_y$ (where $0 \leq x \leq 1$, $0 < y \leq 0.1$, $0 \leq z \leq 1$, $0 \leq u \leq 0.2$) spinel type additional IR phosphor, and device 101 may include in the primary light source 100 a 620-630 nm emitting AlInGaP type LED. More specifically, device 101 may have a wavelength converting structure 108 that includes $Li_{0.49}Sc_{0.05}Ga_{2.384}O_4:Ni_{0.013}$, $Cr_{0.05}$ spinel type additional IR phosphor, and may include as primary light source 100 a 622 nm emitting AlInGaP type LED. Combining such additional IR phosphors with the SWIR phosphors disclosed herein extends the IR emission range of the device 101 to wavelengths shorter than the 1600 nm-2200 nm range, so that the lighting device 101 emits in the 1100 nm-2200 nm.

In another example, the additional IR phosphor included may also need an additional second phosphor system, similar to the second phosphor system described above for use with the SWIR phosphors, in the IR light emitting device having a wider IR emission range. Referring again to FIG. 2, the second phosphor system for use with the additional IR phosphor can widen the spectral range that allows efficient excitation of the additional IR phosphor, and thus increase number of the types of primary light sources 200 that may be used in device 201. That is, the additional second phosphor system for use with the additional IR phosphor 202 may be included with or without the second phosphor system disclosed above for use with the SWIR phosphors disclosed herein. The additional second phosphor system that absorbs first light 204 from a primary light source 200 that emits light outside of the wavelength range required to excite the additional IR phosphor. For instance, the additional second phosphor system 202 may absorb first light 204 emitted from a blue or green LED as primary light source 200. The second phosphor system 202 then emits third light 206 in the red spectral range. The third light 206 emitted from second phosphor system 202 excites the additional IR phosphor portion 208.

For example, device 201 may include green to red emitting phosphors, such as $Eu^{2+}$ phosphors, added as the additional second phosphor system 202, and may use a blue emitting LED as the primary light source 200. Examples of a red emitting phosphor for use in additional second phosphor system 202 include $(Sr,Ca)AlSiN_3:Eu$ and $(Ba,Sr,Ca)_2Si_{5-x}Al_xO_xN_{8-x}:Eu$.

In an example device, primary light source 200 may be a blue light emitting InGaN type emitter. The wavelength converting structure 218 may include an orange-red emitting $(Ba,Sr)_2Si_5N_8:Eu$ phosphor as the additional second phosphor system 202 and a $Li_{0.5-0.5x}(Ga, Sc)_{2.5-0.5x-y}O_4:Ni_x,Cr_y$ spinel phosphor as the additional IR phosphor portion 212 as well as an SWIR phosphor as disclosed herein. In particular, device 201 may include as a primary light source 200 a 440-460 nm emitting InGaN type emitter, and a wavelength converting structure 218 that includes orange-red emitting phosphor $(Ba_{0.4}Sr_{0.6})_{2-x}Si_5N_8:Eu_{0.02}$ as the additional second phosphor system and a $Li_{0.49}Sc_{0.05}Ga_{2.384}O_4:Ni_{0.013}$, $Cr_{0.05}$ as the additional IR phosphor, as well as the SWIR phosphor disclosed herein. The additional second phosphor system 202 may include $Cr^{3+}$ doped phosphors that emit in the 700-1000 nm wavelength range and that can be excited in the blue to green and red spectral ranges. The emission light of such Cr3+ phosphors being reabsorbed by $Ni^{2+}$ doped additional IR phosphors. The additional second phosphor system 202 may include other $Ni^{2+}$ phosphor systems that are known from the literature. Examples include $LaMgGa_{11}O_{19}$:Ni, MgO:Ni, $MgF_2$:Ni, $Ga_2O_3$:Ni,Ge, or garnets of composition $RE_2AEMg_2TV_3O_{12}$:Ni (RE=Y, La, Lu, Gd, Nd, Yb, Tm, Er; AE=Ca, Sr; TV=Si, Ge).

As shown in FIGS. 1 and 2, an IR light emitting device may include a wavelength converting structure that may be used, for example, with light source 100, 200. Light source 100, 200 may be a light emitting diode (LED). Light emitted by the light emitting diode is absorbed by the phosphors in the wavelength converting structure according to embodiments and emitted at a different wavelength. FIG. 3 illustrates one example of a suitable light emitting diode, a III-nitride LED that emits blue light for use in an illumination device such as those disclosed with respect to FIG. 2, in which the SWIR phosphor and/or additional IR phosphor is combined with a second phosphor and/or additional second phosphor that absorbs the blue light and emits the SWIR light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used, as determined by, for example, the range of wavelengths needed to excite the SWIR phosphor, or combination of SWIR phosphor and second phosphor, in the wavelength converting structure.

FIG. 3 illustrates a III-nitride LED 1 that may be used in embodiments of the present disclosure. Any suitable semiconductor light emitting device may be used and embodiments of the disclosure are not limited to the device illustrated in FIG. 3. The device of FIG. 3 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 3. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 3. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the disclosure. The invention is not limited to the particular LED illustrated in FIG. 3. The light source, such as, for example, the LED illustrated in FIG. 3, is illustrated in the following FIGS. 4, 5 and 6 by block 1.

Formation of SWIR Phosphors and Wavelength Converting Structures Including SWIR Phosphors SWIR phosphors disclosed herein can be formed using any suitable method. In one example method, stable compounds, such as, for example, oxides, containing the elements to be formed into the garnet host, sensitizer ion, and rare earth element are mixed in appropriate ratios by, for example, ball milling. The mixture may then be fired at high temperatures, e.g., over 1500 C, with intermediate ball milling. The obtained powder may then be washed, for example, with water, dried, and sieved to form a powder of the SWIR phosphor material having particles with diameters in the range determined by the sieve, for example, less than 50 μm when a 50 μm sieve is used. The resulting SWIR phosphor powder is then used to form wavelength converting structures as described herein.

The wavelength converting structure 108 described with respect to FIG. 1 which may contain one or more of the SWIR phosphors, or a combination of one or more of the SWIR phosphors and one or more of the additional IR phosphors, can be manufactured, for example, in powder form, in ceramic form, or in any other suitable form. The wavelength converting structure 108 may be formed into one or more structures that are formed separately from and can be handled separately from the light source, such as a prefabricated glass or ceramic tile, or may be formed into a structure that is formed in situ with the light source, such as a conformal or other coating formed on or above the source.

In some embodiments, the wavelength converting structure 108 may be powders that are dispersed for example in a transparent matrix, a glass matrix, a ceramic matrix, or any other suitable material or structure. SWIR phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The SWIR phosphors, or combination of SWIR phosphors and additional IR phosphors, can be applied in powder from with e.g. particles in the 3-50 μm average diameter range, to form a wavelength converting structure. The powders may be dispersed in a curable polysiloxane type resin and applied by e.g. means of dispensing into packages comprising primary light emitting LEDs. The powders can also be mixed with a low melting glass powder and heated above the glass softening temperature to form phosphor in glass converter structures (PiG). Alternatively SWIR phosphors can be mixed into a silicone resin and casted or attached to a glass substrate to form a phosphor on glass structure (PoG).

Wavelength converting structure 108 may be formed, for example, by mixing the powder SWIR phosphor, or combination of powder SWIR phosphor and powder additional SWIR phosphor, with a transparent material such as silicone and dispensing or otherwise disposing it in a path of light. In powder form, the average particle size (for example, particle diameter) of the SWIR phosphors and additional IR phosphors may be at least 1 μm in some embodiments, no more than 50 μm in some embodiments, at least 5 μm in some embodiments, and no more than 20 μm in some embodiments. Individual SWIR phosphor particles, or powder SWIR phosphor layers, may be coated with one or more materials such as a silicate, a phosphate, and/or one or more oxides in some embodiments, for example to improve absorption and luminescence properties and/or to increase the material's functional lifetime.

Wavelength converting structures in which a second phosphor system and/or an additional second phosphor system is included, such as the wavelength converting structure 218 described with respect to FIG. 2, can be manufactured using the same methods described above with respect to wavelength converter 108.

The SWIR phosphor and the second phosphor, and/or the additional IR phosphor and additional second phosphor, may be mixed together in a single wavelength converting layer, or formed as separate wavelength converting layers. In a wavelength converting structure with separate wavelength converting layers, SWIR phosphor and the second phosphor, and/or the additional IR phosphor and additional second phosphor, may be stacked such that the second phosphor (and/or additional second phosphor) may be disposed between the SWIR phosphor (and/or the additional IR phosphor) and the light source, or the SWIR phosphor (and/or additional IR phosphor) may be disposed between the second phosphor (and/or additional second phosphor) and the light source.

FIGS. 4, 5, and 6 illustrate devices that combine an LED 1 and a wavelength converting structure 30. The wavelength converting structure 30 may be, for example, wavelength converting structure 108 including an SWIR phosphor as shown in FIG. 1, or wavelength converting structure 218 having an SWIR phosphor and a second phosphor as shown in FIG. 2, according to the embodiments and examples described above.

In FIG. 4, the wavelength converting structure 30 is directly connected to the LED 1. For example, the wavelength converting structure may be directly connected to the substrate 10 illustrated in FIG. 3, or to the semiconductor structure, if the substrate 10 is removed.

In FIG. 5, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 6, the wavelength converting structure 30 is spaced apart from LED 1. The spacing between LED 1 and the wavelength converting structure 30 may be, for example, on the order of millimeters in some embodiments. Such a device may be referred to as a "remote phosphor" device.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device.

A device may also include other wavelength converting materials in addition to the SWIR phosphor, second phosphor, additional IR phosphor, and/or additional second phosphor described above, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance. An example of such a material is $(Al,Ga)_2O_3$ as second phase in polycrystalline ceramics of the structurally disordered cubic garnet SWIR phosphors disclosed herein.

IR Spectrometers

Figure 7:
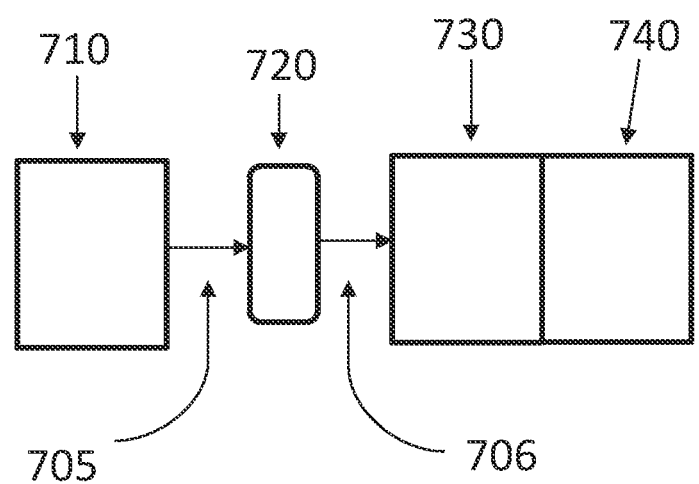
FIG. 7 illustrates an IR spectrometer including an IR emitting device.

FIG. 7 shows a diagram of an IR spectrometer 700. Light emitting devices, such as 101, 201 of FIGS. 1 and 2, having one or more of the SWIR phosphors disclosed herein may be used in spectrometer devices that are used for IR absorption spectroscopy applications. In FIG. 7, the IR spectrometer 700 includes an IR light emitting device 710 that may include one or more of the SWIR phosphors or combination of SWIR phosphor and additional IR phosphors (with or without second phosphor system, or additional second phosphor system, respectively), such as light emitting devices 101, 201. IR light source 710 may also be an IR light source array, such as those described below with respect to FIGS. 8A and 8B. IR spectrometer 700 further includes a sensor/detector 730, for sensing the IR light, which may be, for example a photoresistor or photodiode that can be further combined with light guiding and/or diffracting elements. In one example, the sensor/detector 730 is specifically formed to detect IR light, in particular in a miniaturized device, and includes lead chalcogenide (PbS, PbSe) based photoresistor sensing elements, for example formed into a thin film PbS, which may detect IR radiation over the 1000-3000 nm wavelength range. To provide spectral resolution the sensing elements such as PbS photoresistors may be combined with an array of optical filtering elements such as, for example, band pass filters. The IR spectrometer 700 may further include, for example, a processor 740 for processing data received from the sensor/detector 730. Processor 740 may include a controller function, for controlling the IR light emitting device 710 and/or sensor detector 730. The IR spectrometer 700 may also include a place for a sample 720, if a sample is to be inserted into the IR spectrometer between the IR light emitting device 710 and the sensor detector 730, as shown in FIG. 7. However, in another example (not shown) the sensor/detector may be positioned to detect IR light emitted from the IR light emitting device after it has reflected off of a sample, which may be outside of the IR spectrometer, such that the sensor/detector detects reflection spectra.

In operation, the IR light emitting device 710 emits IR light 705, which may be a broad-band emission over a 1600-2200 nm range, or may be broader, over the 1100-2200 nm range, depending on the phosphor combinations in the wavelength converting structure of the IR light emitting device 710. The emitted light enters the sample 720 (or is reflected off of sample 720, depending on the configuration), and IR light of the IR absorption spectra exits (or is reflected off of) the sample 720 to be detected by sensor/detector 730.

IR Emitting Arrays

Figure 8A:
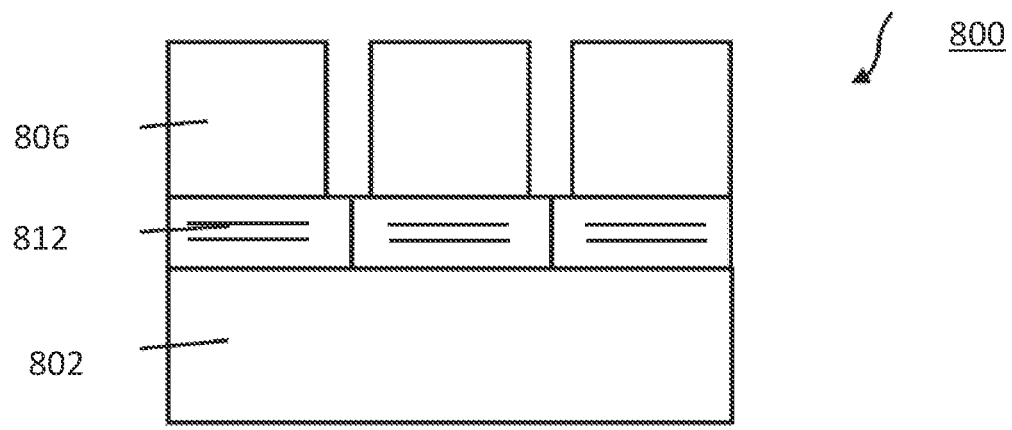
FIGS. 8A and 8B show, respectively, cross-sectional and top schematic views of an array of SWIR pcLEDs.
Figure 8B:
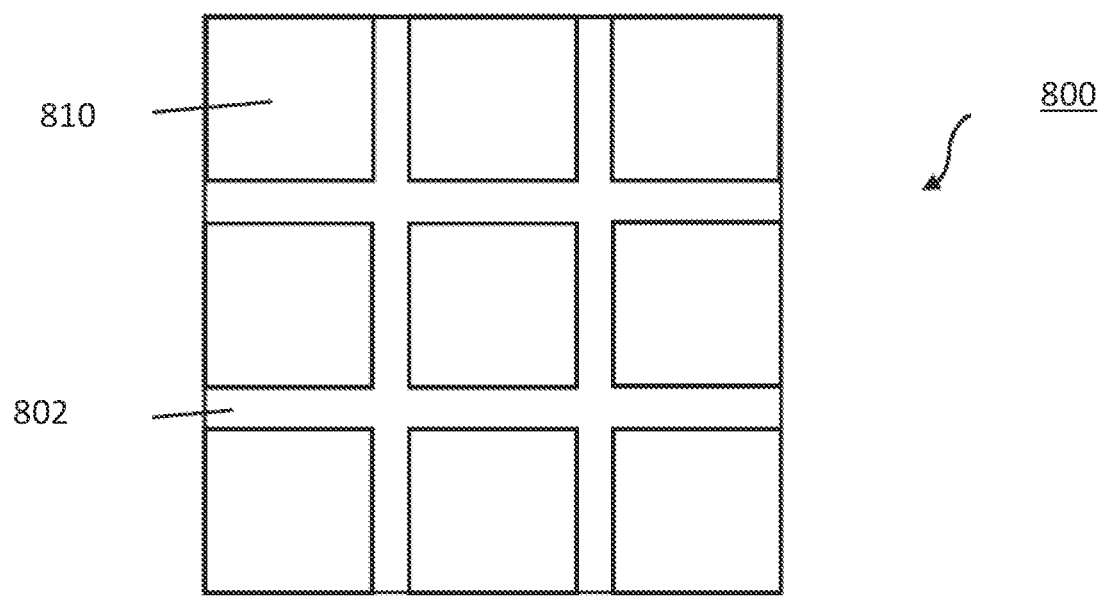

FIGS. 8A-8B show, respectively, cross-sectional and top views of an array 800 of SWIR pcLEDs 810, which SWIR pcLEDs 810 may be structured as lighting device 101, 201, or 710, as shown in FIGS. 1, 2 and 7, respectively, that include a wavelength converter including one or more of the SWIR phosphors as disclosed herein included in phosphor pixels 806 with semiconductor diode 812 disposed on a substrate 802. The wavelength converters may include one or more SWIR phosphors or combination of SWIR phosphors and additional IR phosphors, with or without second phosphor systems and/or additional second phosphor systems as described above. Such an array may include any suitable number of SWIR pcLEDs arranged in any suitable manner. In the illustrated example, the array 800 is depicted as formed monolithically on a shared substrate, but alternatively an array of SWIR pcLEDs may be formed from separate individual pcLEDs. Substrate 802 may optionally comprise CMOS circuitry for driving the LED and may be formed from any suitable materials.

Although FIGS. 8A-8B, show a three-by-three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape or arrangement.

LEDs having dimensions in the plane of the array (e.g., side lengths) of less than or equal to about 50 microns are typically referred to as microLEDs, and an array of such microLEDs may be referred to as a microLED array.

An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 9A:
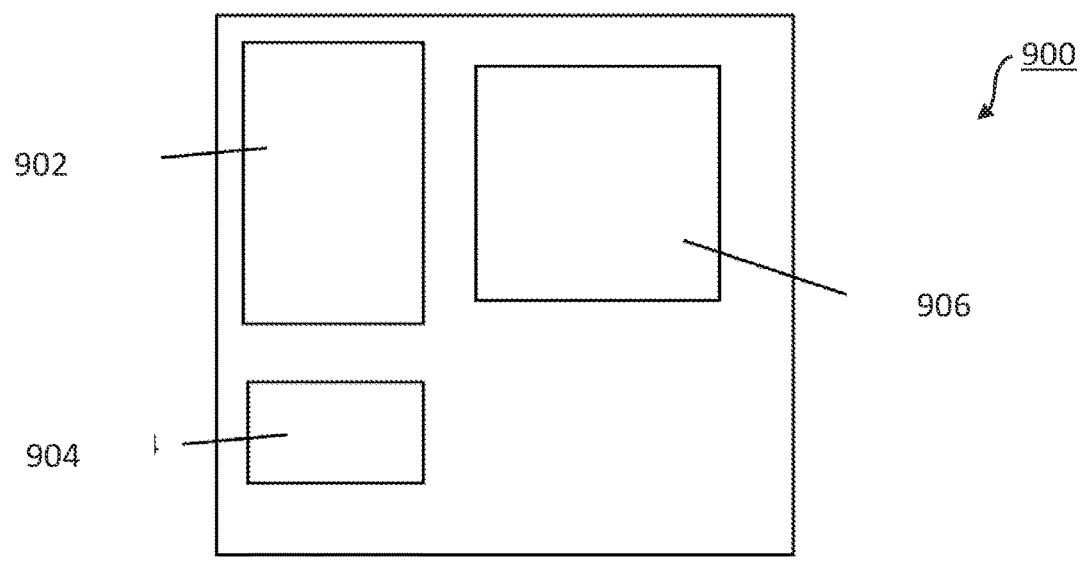
FIG. 9A shows a schematic top view of an electronics board on which an array of pcLEDs may be mounted, and FIG. 9B similarly shows an array of SWIR pcLEDs mounted on the electronic board of FIG. 9A.
Figure 9B:
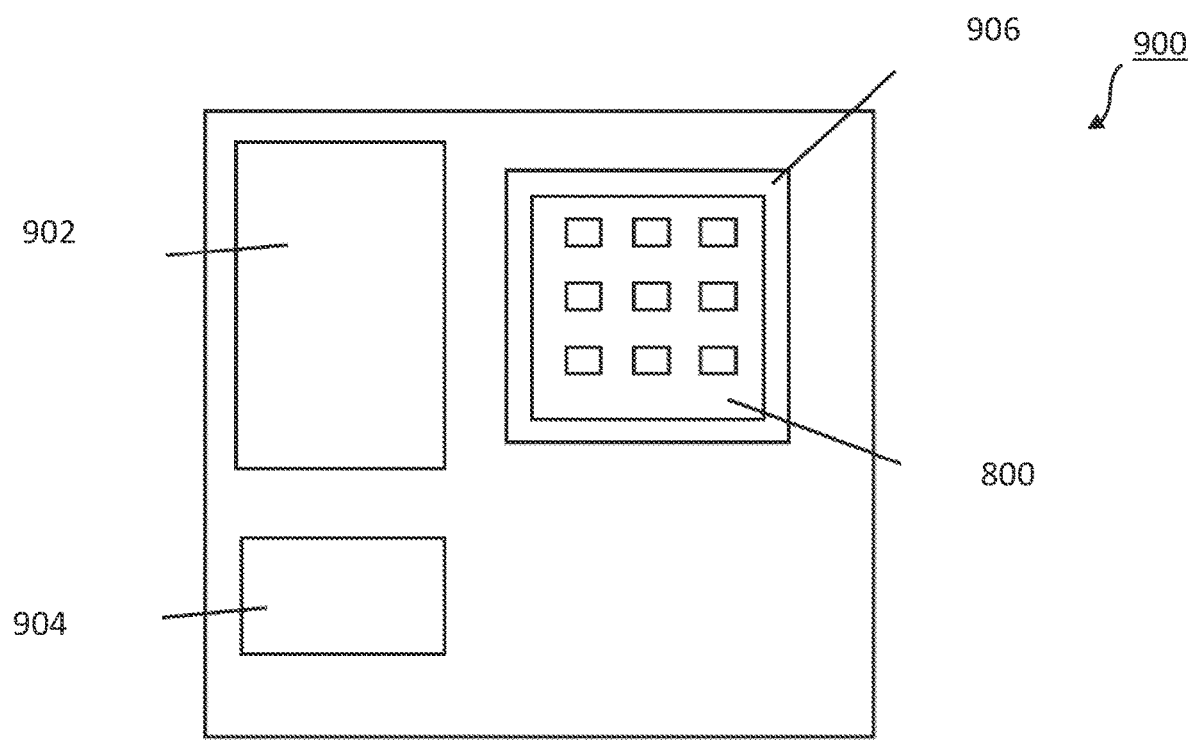

As shown in FIGS. 9A-9B, an SWIR pcLED array 800 may be mounted on an electronics board 900 comprising a power and control module 902, a sensor module 904, and an LED attach region 906. Power and control module 902 may receive power and control signals from external sources and signals from sensor module 904, based on which power and control module 902 controls operation of the LEDs. Sensor module 904 may receive signals from any suitable sensors, for example from temperature or light sensors. Alternatively, SWIR pcLED array 800 may be mounted on a separate board (not shown) from the power and control module and the sensor module.

Figure 10A:
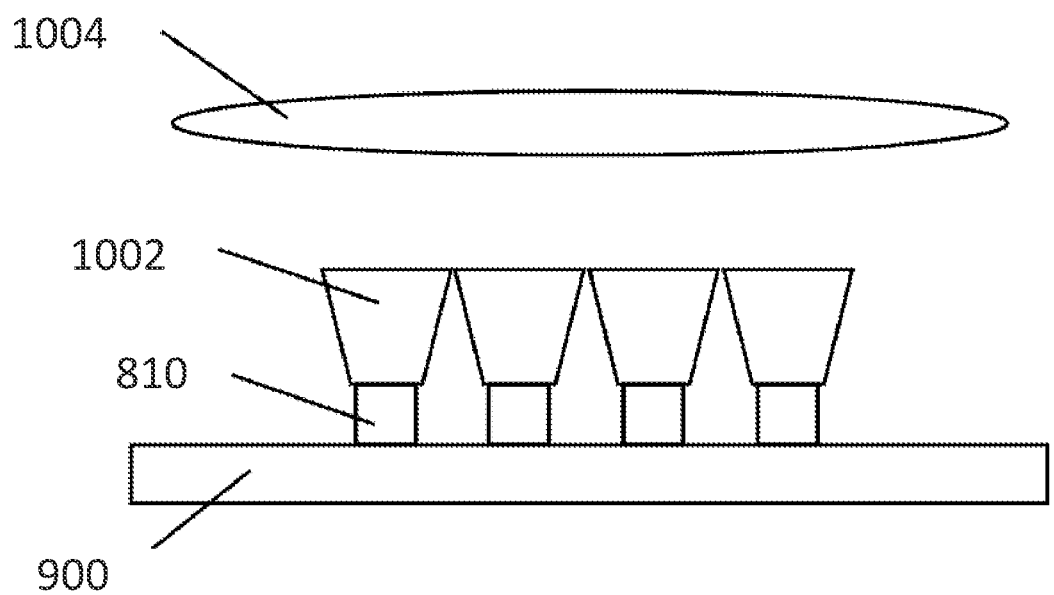
FIG. 10A shows a schematic cross-sectional view of an array of SWIR pcLEDs arranged with respect to waveguides and a projection lens.
Figure 10B:
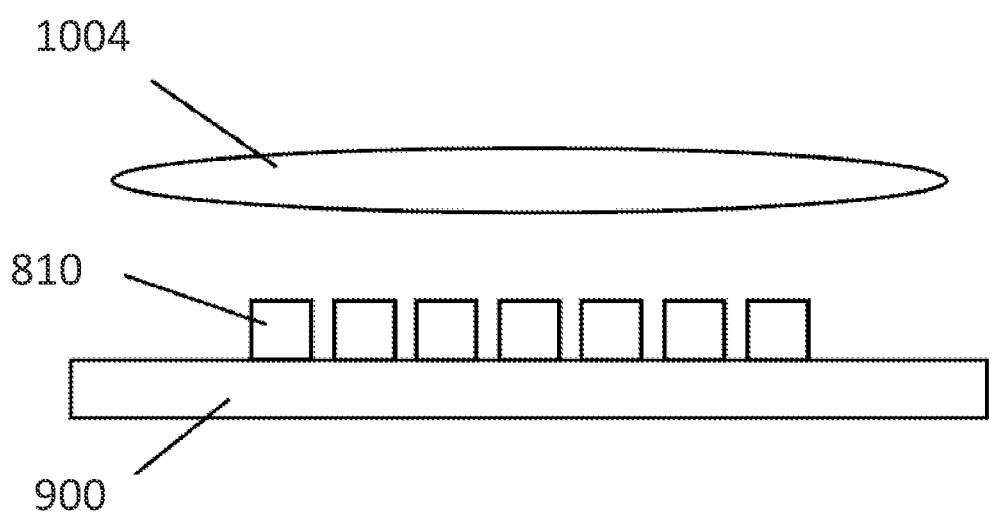
FIG. 10B shows an arrangement similar to that of FIG. 10A, without the waveguides.

Individual SWIR pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 10A-10B an SWIR pcLED array 800 (for example, mounted on an electronics board 900) may be arranged in combination with secondary optical elements such as waveguides, lenses, or both for use in an intended application. In FIG. 10A, light emitted by SWIR pcLEDs 810 is collected by waveguides 1002 and directed to projection lens 1004. Projection lens 1004 may be a Fresnel lens, for example. In FIG. 10B, light emitted by SWIR pcLEDs 810 is collected directly by projection lens 1004 without use of intervening waveguides. This arrangement may be particularly suitable when SWIR pcLEDs can be spaced sufficiently close to each other and may also be used in various applications. A microLED display application may use similar optical arrangements to those depicted in FIGS. 10A-10B, for example. Generally, any suitable arrangement of optical elements may be used in combination with the LED arrays described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by wavelength and/or intensity across an illuminated sample or object and/or is aimed in a desired direction. A controller can be configured to receive data indicating locations and spectral characteristics of objects or persons in a sample, and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for mobile devices, VR, and AR applications.

Figure 11:
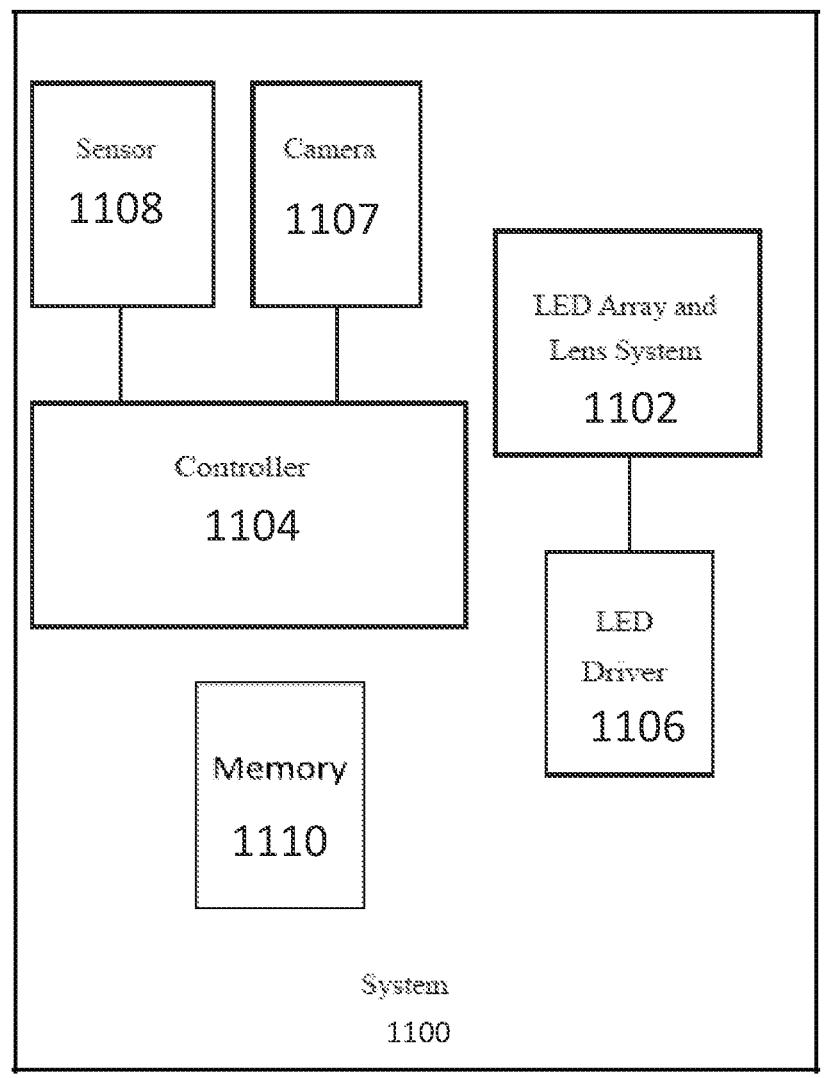
FIG. 11 schematically illustrates an example camera flash system comprising an adaptive illumination system.

FIG. 11 schematically illustrates an example camera flash system 1100 comprising an SWIR pcLED array and lens system 1102, which may be similar or identical to the systems described above. Flash system 1100 also may include an SWIR pcLED driver 1106 that is controlled by a controller 1104, such as a microprocessor. Controller 1104 may also be coupled to a camera 1107 and to sensors 1108, and operate in accordance with instructions and profiles stored in memory 1110. Camera 1107 and adaptive illumination system 1102 may be controlled by controller 1104 to match their fields of view.

Sensors 1108 may include, for example, positional sensors (e.g., a gyroscope and/or accelerometer) and/or other sensors that may be used to determine the position, speed, and orientation of system 1100. The signals from the sensors 1108 may be supplied to the controller 1104 to be used to determine the appropriate course of action of the controller 1104 (e.g., which LEDs are currently illuminating a target and which LEDs will be illuminating the target a predetermined amount of time later).

In operation, illumination from some or all pixels of the LED array in 1102 may be adjusted—deactivated, operated at full intensity, or operated at an intermediate intensity. Beam focus or steering of light emitted by the LED array in 1102 can be performed electronically by activating one or more subsets of the pixels, to permit dynamic adjustment of the beam shape without moving optics or changing the focus of the lens in the lighting apparatus.

Figure 12:
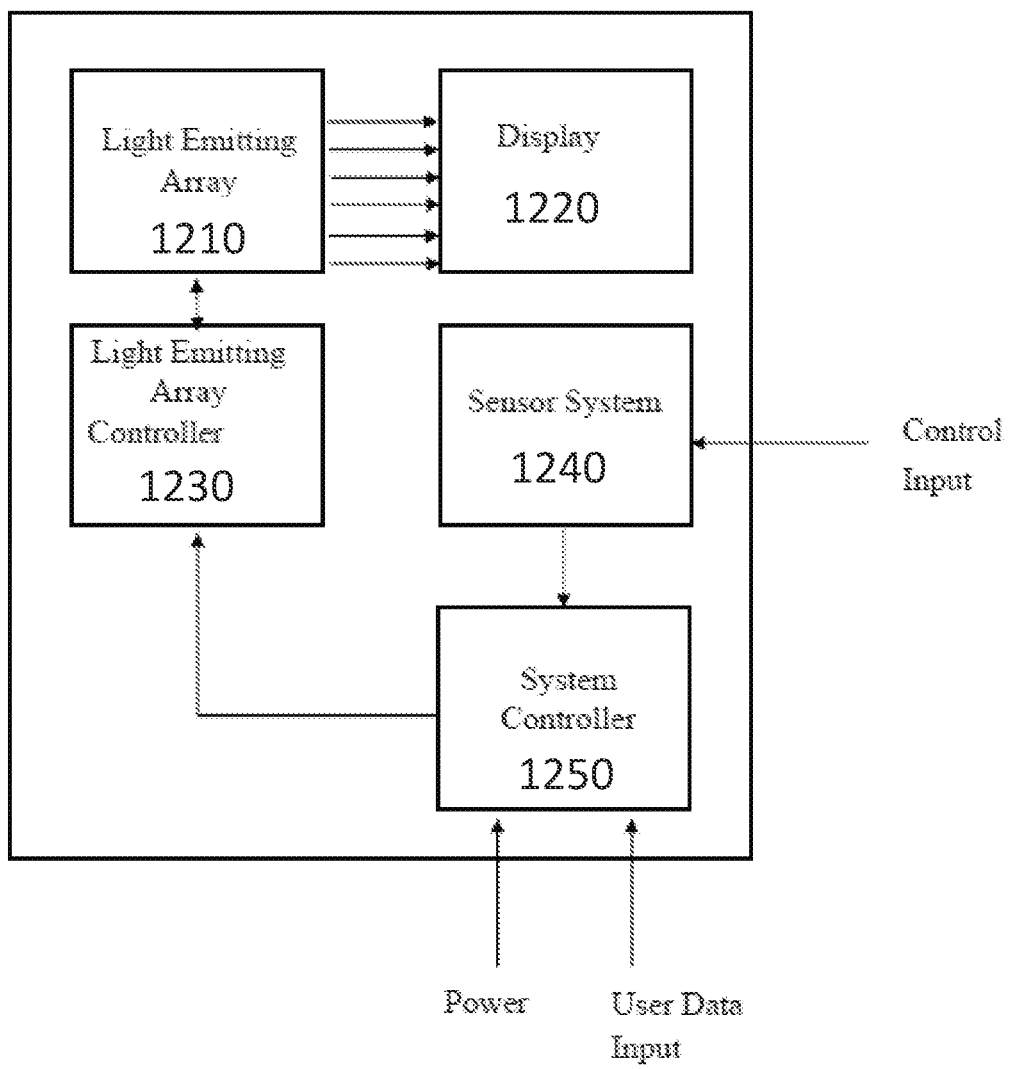
FIG. 12 schematically illustrates an example display (e.g., AR/VR/MR) system that includes an adaptive illumination system.

FIG. 12 schematically illustrates an example display (e.g., AR/VR/MR) system 1200 that includes an adaptive light emitting array 1210, display 1220, a light emitting array controller 1230, sensor system 1240, and system controller 1250. Control input is provided to the sensor system 1240, while power and user data input is provided to the system controller 1250. In some embodiments modules included in system 1200 can be compactly arranged in a single structure, or one or more elements can be separately mounted and connected via wireless or wired communication. For example, the light emitting array 1210, display 1220, and sensor system 1240 can be mounted on a headset or glasses, with the light emitting controller and/or system controller 1250 separately mounted.

The light emitting array 1210 may include one or more adaptive light emitting arrays, as described above, for example, that can be used to project light in graphical or object patterns that can support AR/VR/MR systems. In some embodiments, arrays of microLEDs can be used.

System 1200 can incorporate a wide range of optics in adaptive light emitting array 1210 and/or display 1220, for example to couple light emitted by adaptive light emitting array 1210 into display 1220.

Sensor system 1240 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 1240, system controller 1250 can send images or instructions to the light emitting array controller 1230. Changes or modification to the images or instructions can also be made by user data input, or automated data input as needed. User data input can include but is not limited to that provided by audio instructions, haptic feedback, eye or pupil positioning, or connected keyboard, mouse, or game controller.

EXAMPLES

In the following examples, compositions of SWIR phosphors disclosed herein and pcLEDs including these SWIR phosphors are described.

Example 1

Example 1 describes the synthesis of SWIR phosphor compositions of $Gd_{2.367}Ho_{0.01}Tm_{0.152}Sc_{1.6}Lu_{0.27}Ga_{1.8}Al_{1.78}Cr_{0.04}O_{12}$.
SWIR phosphor of composition $Gd_{2.367}Ho_{0.01}Tm_{0.152}Sc_{1.6}Lu_{0.27}Ga_{1.8}Al_{1.78}Cr_{0.04}O_{12}$ were synthesized by combining 28.7 g gadolinium oxide (Treibacher, >99.98%), 7.66 g scandium oxide (Treibacher, 99.99%), 3.65 g lutetium oxide (Rhodia, 99.99%), 11.6 g gallium oxide (Dowa Electronics Materials, 4N) 0.236 g chromium(II) oxide (Alfa Aesar, 98%), 6.22 g aluminum oxide (Baikowski, SP-DBM), 0.128 g holmium oxide (K. Rasmus & Co, 4N), 2.027 g thulium oxide (Alfa Aesar, >99.9%) and 1.01 g gadolinium fluoride (Materion, 4N). These compounds were mixed by planetary ball milling. The mixture was then fired in an air atmosphere at 1540° C. for 8 hours, followed by ball milling, and next fired in an air atmosphere at 1510° C. for 8 hours. After the second firing of the mixture, crushing and ball milling of the mixture is performed to obtain a powder of the SWIR phosphor. The SWIR phosphor powder was washed with water, dried at 300° C. in air and finally screened through a 50 μm sieve.

Figure 13:
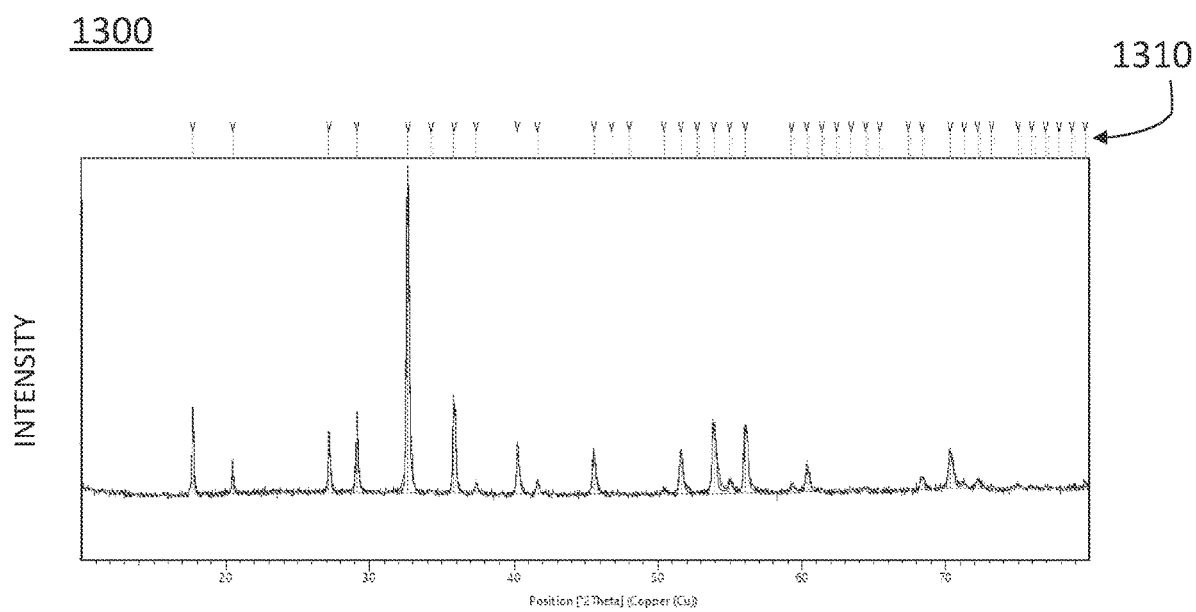
FIG. 13 shows the X-ray powder pattern (copper radiation) of an $Gd_{2.367}Ho_{0.01}Tm_{0.152}Sc_{1.6}Lu_{0.27}Ga_{1.8}Al_{1.78}Cr_{0.04}O_{12}$ SWIR phosphor.

FIG. 13 shows the X-ray powder pattern 1300 (copper radiation) of the $Gd_{2.367}Ho_{0.01}Tm_{0.152}Sc_{1.6}Lu_{0.27}Ga_{1.8}Al_{1.78}Cr_{0.04}O_{12}$ SWIR phosphor obtained in Example 1. The grey lines 1310 represent the position and heights of fitted reflections calculated with the cubic garnet structure model. Example a shows a cubic lattice constant of 12.266 Å and a calculated density of 6.38 g/cm³.

Figure 14:
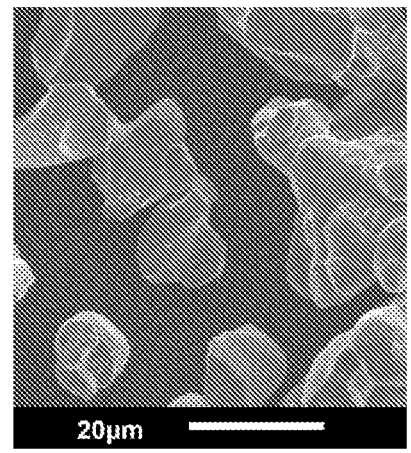
FIG. 14 shows a scanning electron microscopy (SEM) image of an $Gd_{2.367}Ho_{0.01}Tm_{0.152}Sc_{1.6}Lu_{0.27}Ga_{1.8}Al_{1.78}Cr_{0.04}O_{12}$ SWIR phosphor.

FIG. 14 shows a scanning electron microscopy (SEM) image 1400 of the $Gd_{2.367}Ho_{0.01}Tm_{0.152}Sc_{1.6}Lu_{0.27}Ga_{1.8}Al_{1.78}Cr_{0.04}O_{12}$ SWIR phosphor powder obtained in Example 1.

Figure 15:
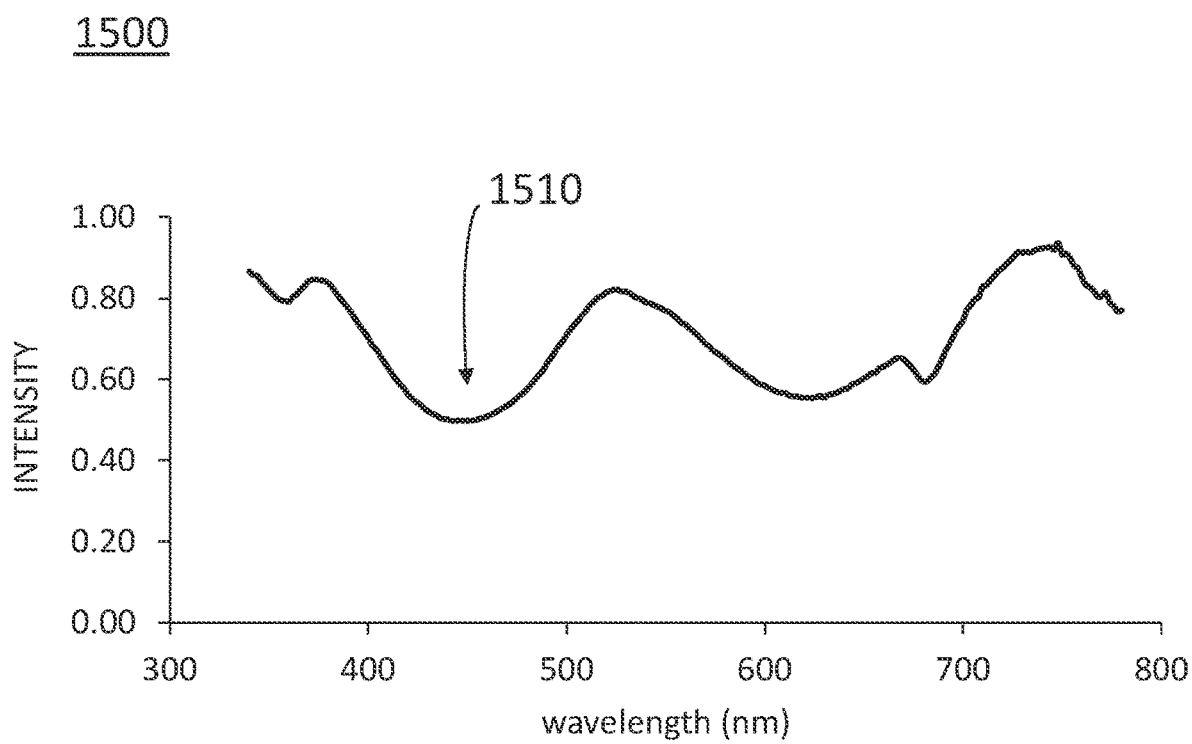
FIG. 15 shows a power reflectance spectrum of an $Gd_{2.367}Ho_{0.01}Tm_{0.152}Sc_{1.6}Lu_{0.27}Ga_{1.8}Al_{1.78}Cr_{0.04}O_{12}$ SWIR phosphor in the visible spectral range.

FIG. 15 shows a power reflectance spectrum 1500 of Example 1 in the visible spectral range. The reflection minimum 1510 in the visible spectral range is in the blue spectral region at around 450 nm.

Example 2

Example 2 describes the formation of an SWIR pcLED that includes the SWIR phosphor synthesized in Example 1. An SWIR pcLED including the SWIR phosphor of Example 1 was formed by mixing a powder of the $Gd_{2.367}Ho_{0.01}Tm_{0.152}Sc_{1.6}Lu_{0.27}Ga_{1.8}Al_{1.78}Cr_0$ synthesized in Example 1 with a thermally curable silicone resin (phosphor/silicone weight ratio 1.6) under vacuum. The mixture of SWIR phosphor and thermally curable silicone resin was dispensed into a midpower LED packages containing InGaN blue emitters (emission wavelength ~450 nm).

Figure 16:
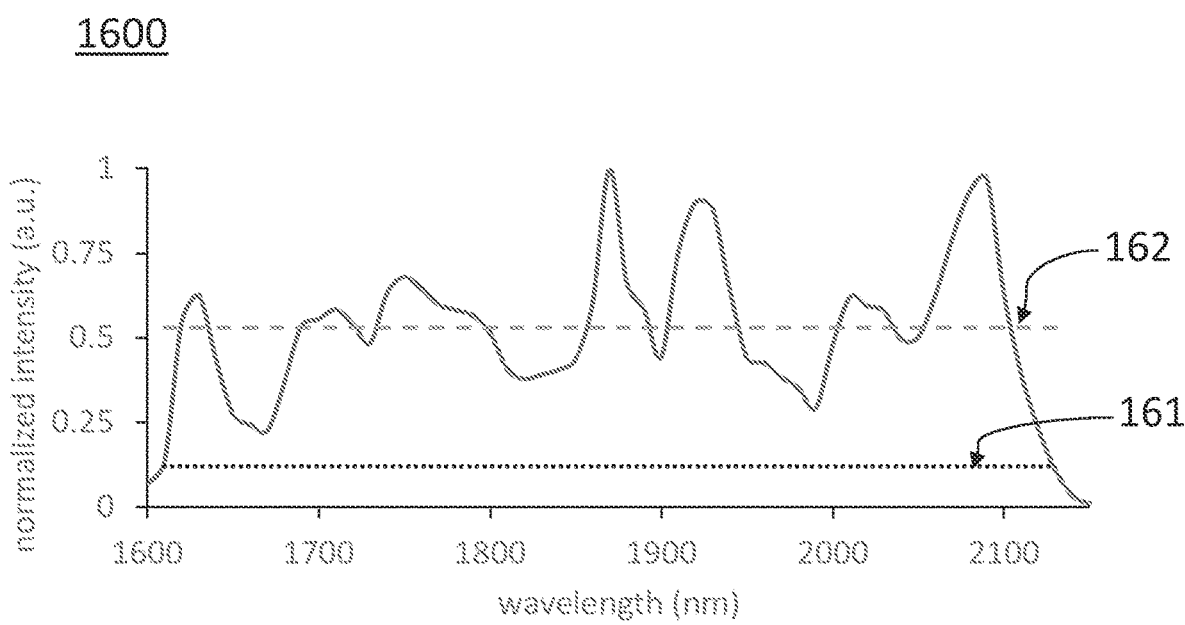
FIG. 16 shows the normalized short-wave infrared emission spectrum of an SWIR pcLED including an $Gd_{2.367}Ho_{0.01}Tm_{0.152}Sc_{1.6}Lu_{0.27}Ga_{1.8}Al_{1.78}Cr_{0.04}O_{12}$ SWIR phosphor.

FIG. 16 shows the normalized short-wave infrared emission spectrum 1600 of the SWIR pcLED formed in Example 2. The emission spectrum shows that emission from the SWIR pcLED covers the range from 1610-2130 nm. For the wavelength range 1610-2130 nm the minimum 161 and average 162 emission power relative to the maximum emission power is larger than 12% and 53% (dotted and dashed lines), respectively.

Example 3

Example 3 describes the synthesis of SWIR phosphor compositions of $Gd_{2.59}Tm_{0.24}Ho_{0.02}Sc_{0.75}Lu_{0.3}Ga_2Al_2Cr_{0.1}O_{12}$. SWIR phosphor of composition $Gd_{2.59}Tm_{0.24}Ho_{0.02}Sc_{0.75}Lu_{0.3}Ga_2Al_2Cr_{0.1}O_{12}$ gadolinium oxide (Treibacher, >99.98%), 3.39 g scandium oxide (Treibacher, 99.99%), 3.87 g lutetium oxide (Rhodia, 99.99%), 12.34 g gallium oxide (Dowa Electronics Materials, 4N) 0.493 g chromium(II) oxide (Alfa Aesar, 98%), 6.22 g aluminum oxide (Baikowski, SP-DBM), 0.255 g holmium oxide (K. Rasmus & Co, 4N), 2.995 g thulium oxide (Alfa Aesar, >99.9%) and 1.04 g gadolinium fluoride (Materion, 4N). The compounds were mixed by planetary ball milling. The mixture was then fired in an air atmosphere at 1540° C. for 8 hours, followed by ball milling, and next fired in an air atmosphere at 1510° C. for 8 hours. After the second firing of the mixture, crushing and ball milling of the mixture is performed to obtain a powder of the SWIR phosphor. The SWIR phosphor powder was washed with water, dried at 300° C. in air and finally screened through a 50 µm sieve.

Figure 17:
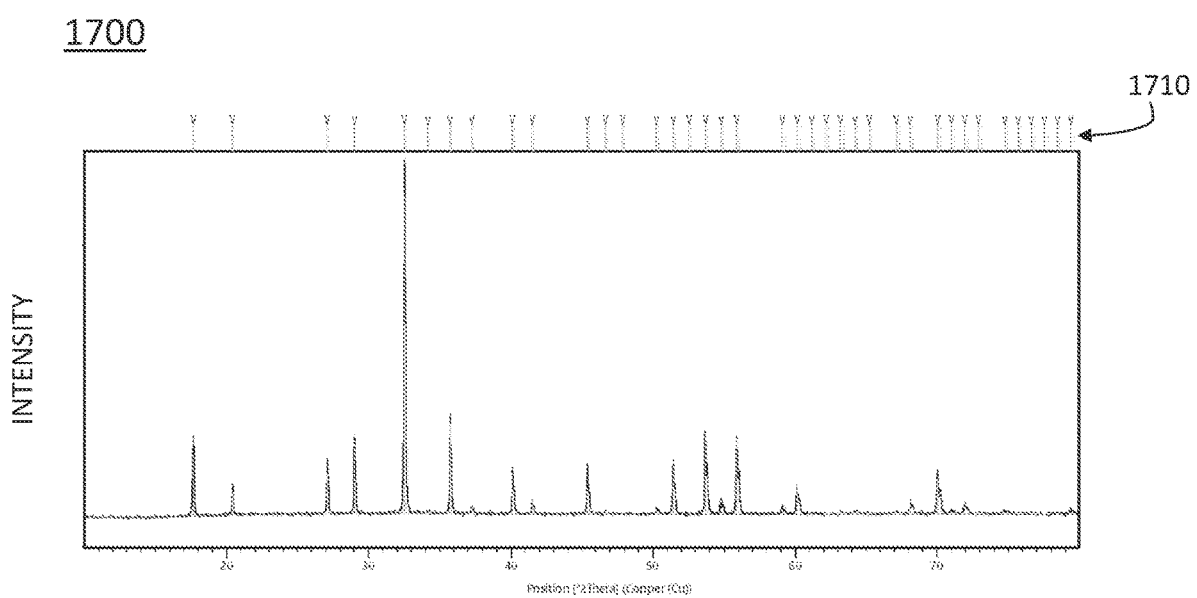
FIG. 17 shows the X-ray powder pattern (copper radiation) of $Gd_{2.59}Tm_{0.24}Ho_{0.02}Sc_{0.75}Lu_{0.3}Ga_2Al_2Cr_{0.1}O_{12}$ SWIR phosphor.

FIG. 17 shows the X-ray powder pattern 1700 (copper radiation) of SWIR phosphor compositions of $Gd_{2.59}Tm_{0.24}Ho_{0.02}Sc_{0.75}Lu_{0.3}Ga_2Al_2Cr_{0.1}O_{12}$ formed in Example 3. The grey lines 1710 represent the position and heights of fitted reflections calculated with the cubic garnet structure model. Example a shows a cubic lattice constant of 12.301 Å and a calculated density of 6.62 g/cm$^3$.

Example 4

Example 4 describes the formation of an SWIR pcLED that includes the SWIR phosphor synthesized in Example 3. An SWIR pcLED including the SWIR phosphor of Example 3 was formed by mixing a powder of the $Gd_{2.59}Tm_{0.24}Ho_{0.02}Sc_{0.75}Lu_{0.3}Ga_2Al_2Cr_{0.1}O_{12}$ synthesized in Example 3 with a thermally curable silicone resin (phosphor/silicone weight ratio 1.6) under vacuum. The mixture of SWIR phosphor and thermally curable silicone resin was dispensed into a midpower LED packages containing InGaN blue emitters (emission wavelength ~450 nm).

Figure 18:
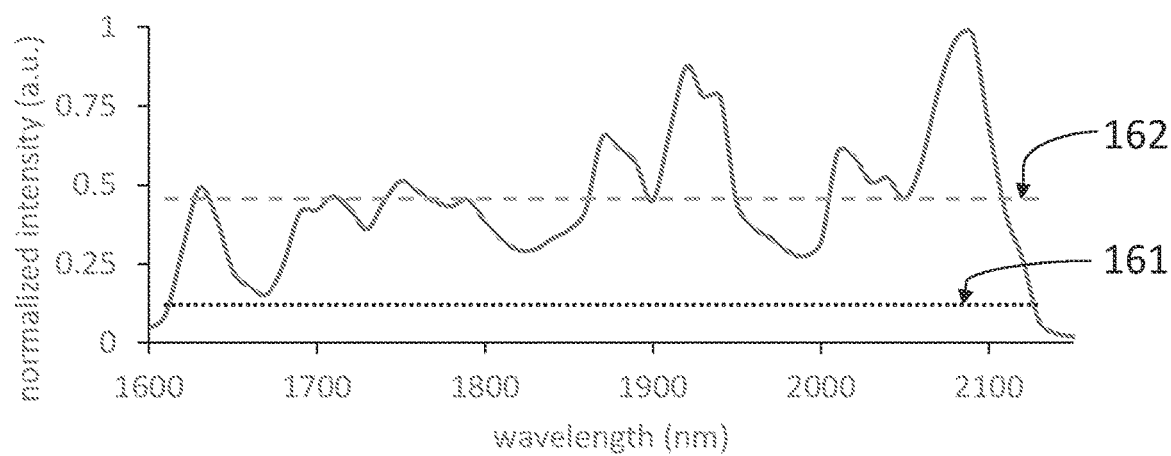
FIG. 18 shows the normalized short-wave infrared emission spectrum of the SWIR pcLED including an $Gd_{2.59}Tm_{0.24}Ho_{0.02}Sc_{0.75}Lu_{0.3}Ga_2Al_2Cr_{0.1}O_{12}$ SWIR phosphor.

FIG. 18 shows the normalized short-wave infrared emission spectrum 1800 of the SWIR pcLED formed in Example 4. The emission spectrum shows that emission from the SWIR pcLED covers the 1600-2130 nm spectral range. For the wavelength range 1610-2130 nm the minimum 181 and average 182 emission power relative to the maximum emission power is larger than 12% and 46% (dotted and dashed lines), respectively.

Example 5

Example 5 describes the formation of a wavelength converting structure that is a composite ceramic plate including the SWIR garnet phosphor composition $Gd_2Ho_{0.013}Tm_{0.2}Sc_{0.67}Lu_{0.24}Ga_{1.6}Al_{3.2}Cr_{0.08}O_{12}$ as the main polycrystalline phase and an additional $(Al,Ga)_2O_3$ as the minority phase. The SWIR phosphor composition $Gd_2Ho_{0.013}Tm_{0.2}Sc_{0.67}Lu_{0.24}Ga_{1.6}Al_{3.2}Cr_{0.08}O_{12}$ was prepared by combining 89.92 g gadolinium oxide (Treibacher, >99.98%), 11.58 g scandium oxide (Treibacher, 99.99%), 11.85 g lutetium oxide (Rhodia, 99.99%), 37.18 g gallium oxide (Dowa Electronics Materials, 4N), 1.512 g chromium (II) oxide (Alfa Aesar, 98%), 40.46 g aluminum oxide (Baikowski, SP-DBM), 0.611 g holmium oxide (K. Rasmus & Co, 4N), and 9.57 g thulium oxide (Alfa Aesar, >99.9%). These compounds were mixed in 99 g ethanol and 107 µl tetraethylorthosilicate (Merck, p.a.) by means of ball milling with a dispersant added (2 wt % Malialim AKM-0531) until an average particle size of 0.72 µm was reached. After addition of a polyvinylbutyral binder and plasticizer system (Sekisui BL-5, G-260), ceramic tapes were casted, dried, stacked and laminated. After de-bindering at 600° C., the ceramic plates were sintered at 1580° C. for 8 hrs in air atmosphere. The obtained composite ceramics with a thickness of 197 µm mainly crystallize in the cubic garnet structure with a lattice constant $a_0 = 12.160$ Å with some $(Al,Ga)_2O_3$ secondary phase.

Figure 19:
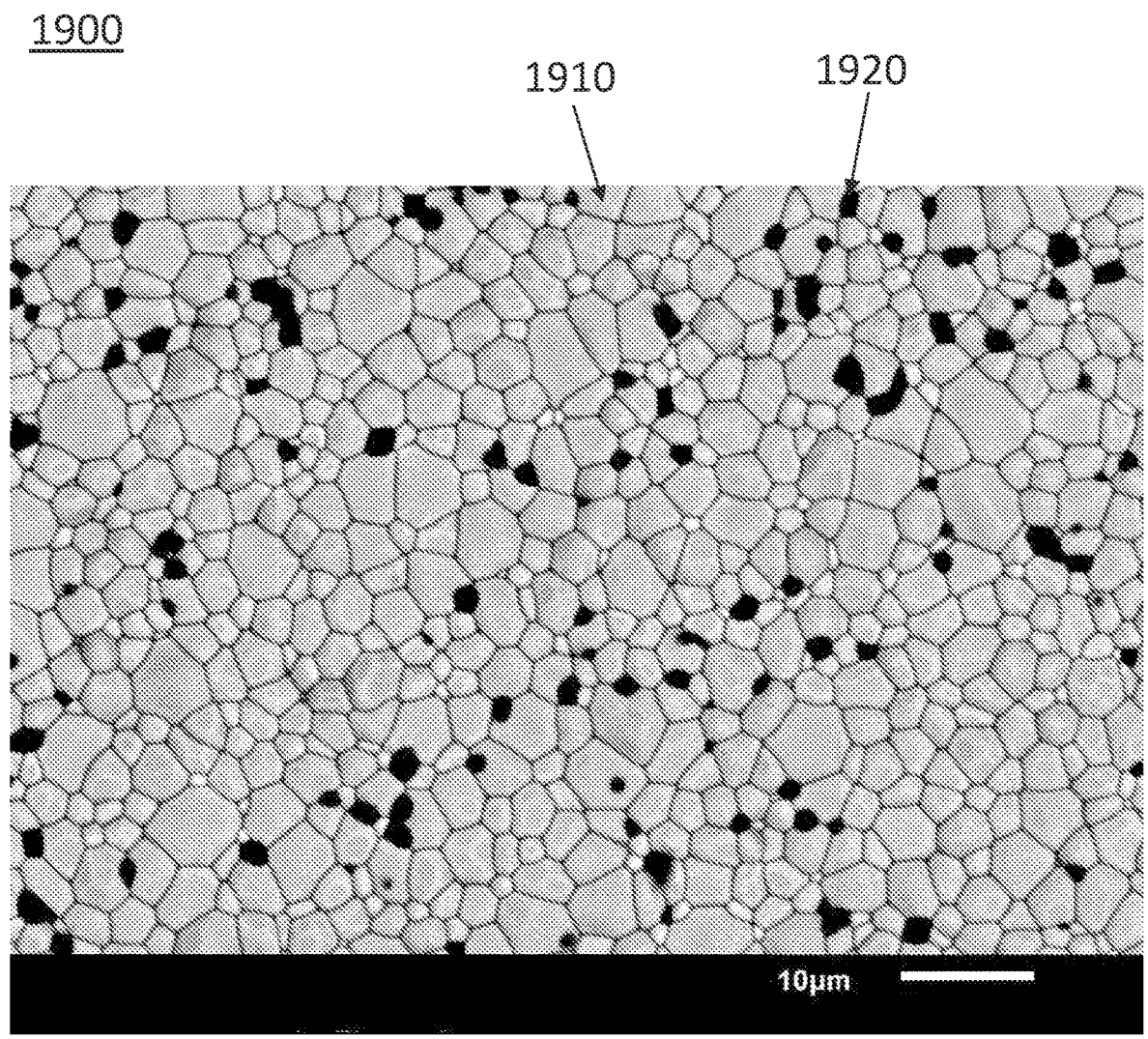
FIG. 19 shows a scanning electron micrograph of the sintered SWIR phosphor ceramic of Example 5.

FIG. 19 shows a scanning electron micrograph 1900 of the as sintered SWIR phosphor ceramic. Light ceramic grains 1910 are the garnet phosphor phase while the dark ceramic grains 1920 are made up from the $(Al,Ga)2O3$ secondary phase.

Example 6

The SWIR phosphor composite ceramics of Example 5 were coated with silica and niobia oxide layers according to the recipe in the following Table 1 to obtain a dichroic coating. The coating was applied on the surfaces of the as-sintered ceramics by reactive sputtering with silicon and niobium metal targets and oxygen as the reactive gas.

TABLE 1

| Layer # | Oxide | Thickness (nm) |
| --- | --- | --- |
| 1 | SiO2 | 92.72 |
| 2 | Nb2O5 | 52.66 |
| 3 | SiO2 | 77.23 |
| 4 | Nb2O5 | 39.97 |
| 5 | SiO2 | 83.03 |
| 6 | Nb2O5 | 51.59 |
| 7 | SiO2 | 88.73 |
| 8 | Nb2O5 | 49.94 |
| 9 | SiO2 | 117.10 |
| 10 | Nb2O5 | 68.72 |
| 11 | SiO2 | 123.47 |
| 12 | Nb2O5 | 82.25 |
| 13 | SiO2 | 133.99 |
| 14 | Nb2O5 | 85.52 |
| 15 | SiO2 | 155.73 |
| 16 | Nb2O5 | 106.80 |
| 17 | SiO2 | 140.12 |
| 18 | Nb2O5 | 84.95 |

Figure 20:
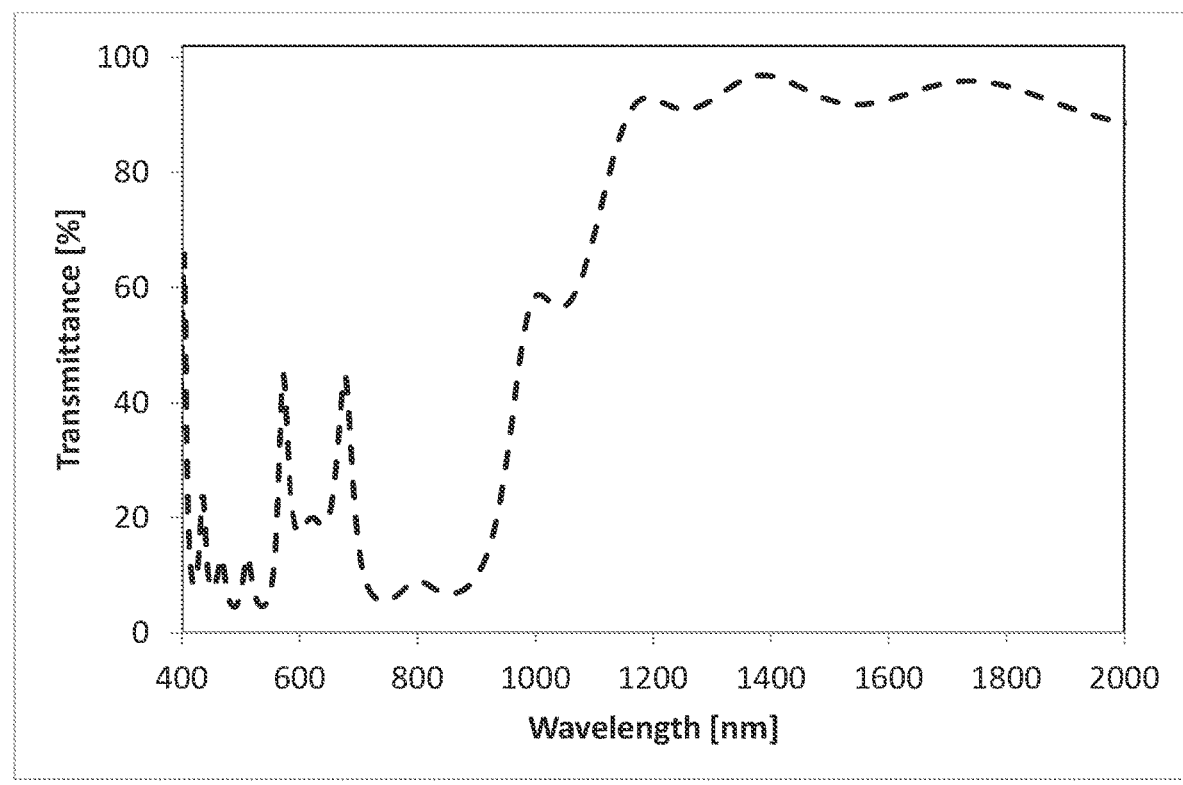
FIG. 20 shows the light transmission of the coated ceramic plate of Example 6.

FIG. 20 shows a graph 2000 of the light transmission as a function of wavelength for the coated ceramic of this example obtained for an incidence angle of 0°

Example 7

After dicing the ceramics made in Example 6 into platelets of size 1060×1060 µm, the obtained converter structures were attached (with the non-coated surfaces) to 440 nm emitting InGaN primary LED (LUXEON™, Lumileds) light sources having 1 mm² light emitting surfaces. The converter structures were attached with the non-coated surfaces disposed on the LED.

Figure 21:
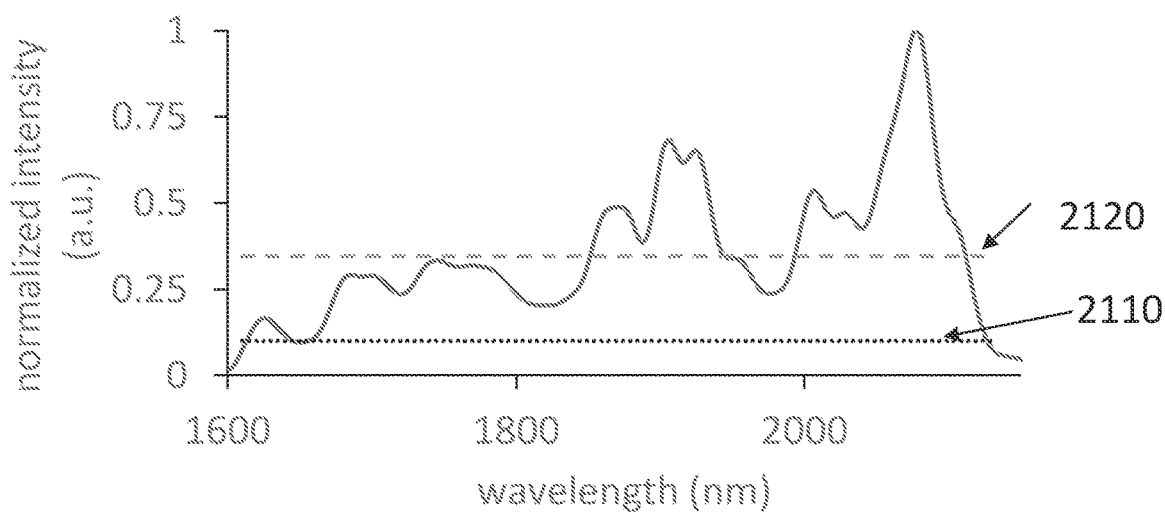
FIG. 21 SWIR emission spectrum of the phosphor converted LED of Example 7.
Figure 22A:
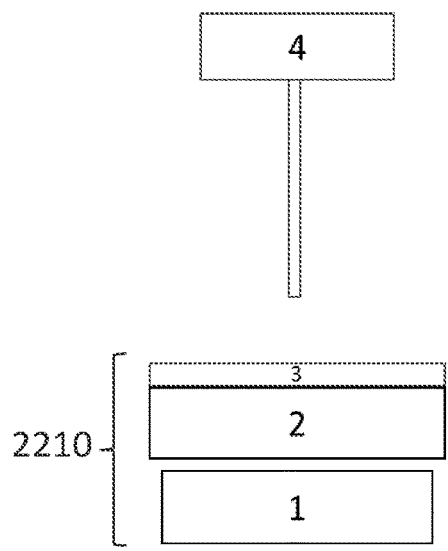
FIG. 22A schematically illustrates an IR spectroscopy test apparatus.
Figure 22B:
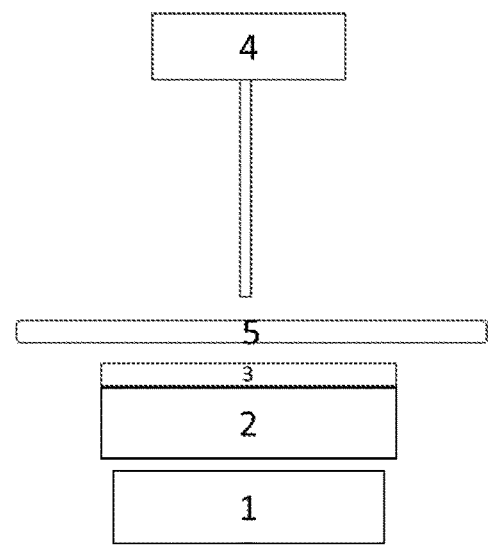
FIG. 22B schematically illustrates the IR spectroscopy test apparatus of FIG. 22A with a test sample.
Figure 23:
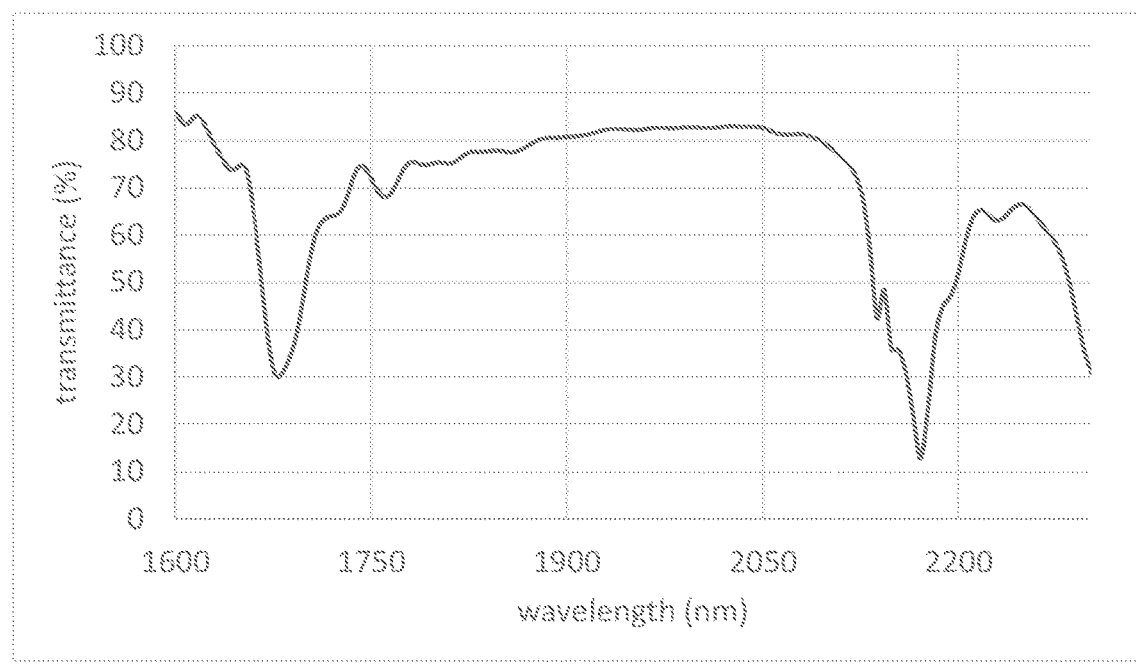
FIG. 23 is the FT-IR spectrum of a polystyrene test sample.

FIG. 21 shows the SWIR emission spectrum 2100 of the phosphor converted LEDs formed in this example. As can be seen in FIG. 21, the emission spectrum shows that emission from the SWIR pcLED covers the 1600-2130 nm spectral range. For the wavelength range 1610-2130 nm the minimum 2110 and average 2120 emission power relative to the maximum emission power is larger than 10% and 35%, respectively. The apparatus shown in FIGS. 22A and 22B was used to test the SWIR pcLED of Example 7 as a light source for spectroscopy. In FIGS. 22A and 22B, test apparatus 2200 includes the SWIR pcLED formed in this example 2210, including the blue light emitting InGaN primary LED 1 with the wavelength converting structure 2 with the dichroic coating 3 formed in Example 6 attached. The SWIR pcLED 2210 is positioned close to an IR spectrometer fiber optic 4. FIG. 22B shows a test sample (polystyrene) 5. The SWIR pcLED 2210 was brought into proximity (10-20 mm distance) of the fiber optic of a Nanoquest® FT-IR spectrometer 4 (Ocean Inside), and first a reference spectrum was recorded, before a polystyrene test sample 5 was placed in the light path (FIG. 22). FIG. 23 shows the FT-IR spectrum of the polystyrene test sample.

Example 8

Figure 24:
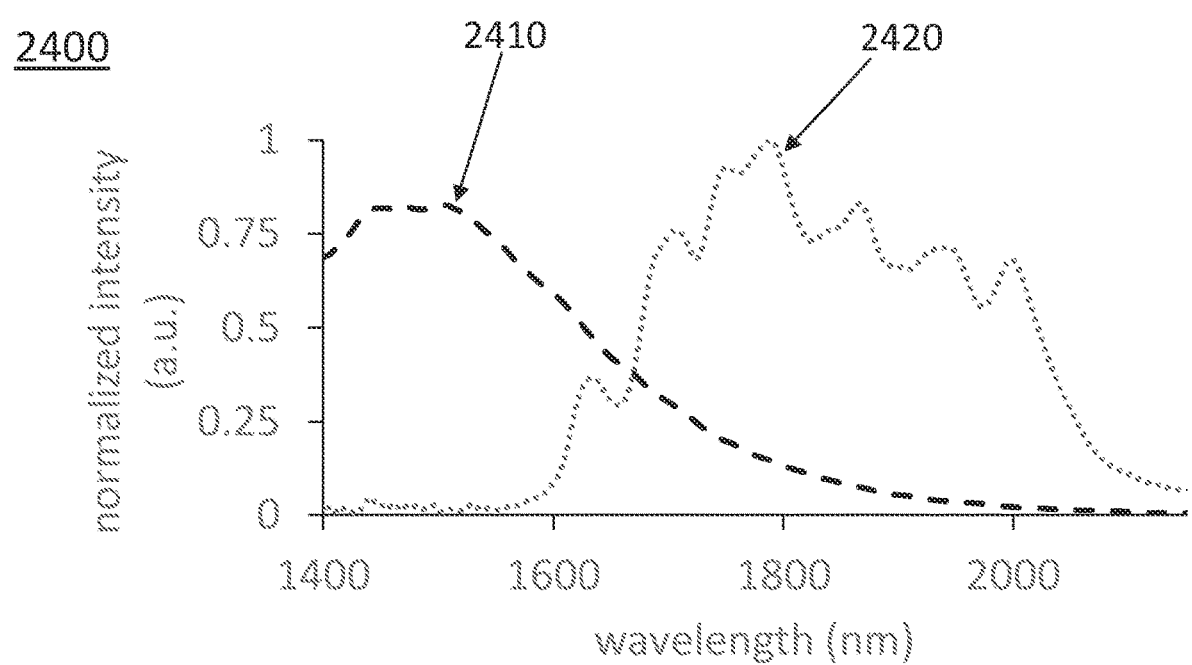
FIG. 24 is the spectral power distribution in the SWIR wavelength range of the phosphors of Example 8.

Example 8 describes the formation of a light source for spectroscopy that includes two different phosphors formed in two different wavelength converting structures to extend the light source emission to shorter wavelengths. The light source of this example includes two wavelength converting structures: (1) a first wavelength convertering structure including the SWIR phosphor $Gd_{2.32}Tm_{0.18}Sc_{1.5}Lu_{0.3}Ga_{1.81}Al_{1.81}Cr_{0.01}O_{12}$ disclosed herein, and (2) a second ceramic wavelength converting structure including a garnet structure according to the specifications given U.S. patent application Ser. No. 17/035,233, filed Sep. 23, 2020, titled "SWIR pcLED and Phosphor Emitting in the 1100-1700 nm Range" with a composition $Gd_3Ga_{3.7}ScAl_{0.18}Ni_{0.02}Zr_{0.021}Cr_{0.1}O_{12}$ and a lattice constant $a_0=12.3222$ Å. The first wavelength converting structure was formed as a ceramic plate including the SWIR garnet phosphor composition $Gd_{2.32}Tm_{0.18}Sc_{1.5}Lu_{0.3}Ga_{1.81}Al_{1.81}Cr_{0.01}O_{12}$ and was manufactured using the process as described for Example 5. For example 8, 78.251 g gadolinium oxide (Treibacher, 3N5), 19.451 g scandium oxide (Treibacher, 4N), 11.114 g lutetium oxide (Rhodia, 4N), 31.54 g gallium oxide (Dowa Electronics Materials, 4N), 1.41 g chromium(III) oxide (Alfa Aesar, 99%), 17.17 g aluminum oxide (Baikowski, SP-DBM), 6.445 g thulium oxide (Treibacher, 4N) and 110 μl tetraethylorthosilicate (Merck, p.a.) were milled in ethanol until an average particle size of 0.87 μm was reached. After the forming and firing steps as described for Example 5 ceramic SWIR phosphor ceramics with a unit cell constant $a_0=12.293$ Å are being obtained. The second wavelength converting structure was formed as described in U.S. patent application Ser. No. 17/035,233, filed Sep. 23, 2020, titled "SWIR pcLED and Phosphor Emitting in the 1100-1700 nm Range. The first and second ceramic converter structures including, respectively, the $Gd_3Ga_{3.7}ScAl_{0.18}Ni_{0.02}Zr_{0.021}Cr_{0.1}O_{12}$ and $Gd_{2.32}Tm_{0.18}Sc_{1.5}Lu_{0.3}Ga_{1.81}Al_{1.81}Cr_{0.01}O_{12}$ phosphors were mounted on 440 nm emitting LED primary light sources to obtain an illumination system with the spectral power distribution in the SWIR wavelength range 2400 shown in FIG. 24. In FIG. 24, the dashed line 2410 shows the spectral power distribution of the illumination system with only the $Gd_3Ga_{3.7}ScAl_{0.18}Ni_{0.02}Zr_{0.021}Cr_{0.1}O_{12}$ phosphor material excited by the blue emitting primary LED light source, while the dotted line 2420 shows the spectral power distribution of the illumination system with only the $Gd_{2.32}Tm_{0.18}Sc_{1.5}Lu_{0.3}Ga_{1.81}Al_{1.81}Cr_{0.01}O_{12}$ phosphor material excited by the blue emitting primary LED light source.

This disclosure is illustrative and not limiting. Further modifications will be apparent to one skilled in the art in light of this disclosure and are intended to fall within the scope of the appended claims.

The invention claimed is:

1. A wavelength converting structure comprising an SWIR phosphor having emission wavelengths in the range of 1600-2200 nm, the SWIR phosphor comprising a structurally disordered garnet material, a sensitizer ion, and at least one rare earth emitter ion.

2. The wavelength converting structure of claim 1, wherein the structurally disordered garnet material comprises a cubic garnet host lattice with 8-fold coordinated Gd atoms, 6-fold coordinated Ga atoms, and 4-fold coordinated Ga atoms.

3. The wavelength converting structure of claim 1, wherein the structurally disordered garnet material comprises one or more atoms selected from the group Sc, Lu, Ga and Al that can occupy more than one lattice site and at a concentration greater than 1 atom %.

4. The wavelength converting structure of claim 1, wherein the rare earth emitter ion comprises at least one of Tm, Ho, La, Y, Yb, Nd, Er, and Ce.

5. The wavelength converting structure of claim 1, wherein the rare earth emitter ion consists of Tm and Ho.

6. The wavelength converting structure of claim 1, wherein the rare earth emitter ion consists of Tm.

7. The wavelength converting structure of claim 1, wherein the SWIR phosphor comprises $(Gd_{3-u-v-x-y-z}Lu_xTm_yHo_zSc_vRE_u)[Sc_{2-a-b}Lu_aCr_bGa_dAl_e]\{Ga_{3-c}Al_c\}O_{12}$ with RE=La, Y, Yb, Nd, Er, Ce and $0 \le u \le 2$, $0 < v \le 1$, $0 < x \le 1$, $0 < y \le 0.5$, $0 \le z \le 0.05$, $0 < a \le 1$, $0 < b \le 0.3$, $0 \le c \le 3$, $0 < d \le 1.8$, $0 \le e \le 1.8$.

8. The wavelength converting structure of claim 6, wherein the SWIR phosphor comprises at least one of $Gd_{2.367}Ho_{0.01}Tm_{0.152}Sc_{1.6}Lu_{0.27}Ga_{1.8}Al_{1.78}Cr_{0.04}O_{12}$, $Gd_{2.59}Tm_{0.24}Ho_{0.02}Sc_{0.75}Lu_{0.3}Ga_2Al_2Cr_{0.1}O_{12}$, $Gd_2Ho_{0.013}Tm_{0.2}Sc_{0.67}Lu_{0.24}Ga_{1.6}Al_{3.2}Cr_{0.08}O_{12}$, and $Gd_{2.67}Ho_{0.01}Tm_{0.17}Sc_{1.8}Lu_{0.3}Ga_2AlCr_{0.05}O_{12}$.

9. The wavelength converting structure of claim 1, further comprising an additional IR phosphor having emission in the wavelength range of 1100-1700 nm.

10. The wavelength converting structure of claim 9, wherein the additional IR phosphor comprises one or more of Ni2+, or Ni2+ and Cr3+ doped spinel, perovskite, and garnet type IR phosphor emitting in the 1000-1700 nm range.

11. A luminescent material that emits lighting having emissions wavelengths in the range of 1600-2200 nm, the luminescent material comprising a structurally disordered garnet material doped with at least one sensitizer ion and at least one rare earth emitter ion.

12. The luminescent material of claim 11, wherein the structurally disordered garnet material comprises a cubic garnet host lattice with 8-fold coordinated Gd atoms, 6-fold coordinated Ga atoms, and 4-fold coordinated Ga atoms.

13. The luminescent material of claim 11, wherein the structurally disordered garnet material comprises one or more atoms selected from the group Sc, Lu, Ga and Al that can occupy more than one lattice site and at a concentration greater than 1 atom %.

14. The luminescent material of claim 11, wherein the rare earth emitter ion comprises at least one of Tm, Ho, La, Y, Yb, Nd, Er, and Ce.

15. The luminescent material of claim 11, wherein the rare earth emitter ion consists of Tm and Ho.

16. The luminescent material of claim 11, comprising $(Gd_{3-u-v-x-y-z}Lu_xTm_yHo_zSc_vRE_u)[Sc_{2-a-b}Lu_aCr_bGa_dAl_e]\{Ga_{3-c}Al_c\}O_{12}$ with RE=La, Y, Yb, Nd, Er, Ce and $0 \le u \le 2$, $0 < v \le 1$, $0 < x \le 1$, $0 < y \le 0.5$, $0 \le z \le 0.05$, $0 < a \le 1$, $0 < b \le 0.3$, $0 \le c \le 3$, $0 < d \le 1.8$, $0 \le e \le 1.8$.

17. The luminescent material of claim 11, wherein the rare earth emitter ion consists of Tm.

18. The luminescent material of claim 11, wherein the SWIR phosphor comprises at least one of $Gd_{2.367}Ho_{0.01}Tm_{0.152}Sc_{1.6}Lu_{0.27}Ga_{1.8}Al_{1.78}Cr_{0.04}O_{12}$, $Gd_{2.59}Tm_{0.24}Ho_{0.02}Sc_{0.75}Lu_{0.3}Ga_2Al_2Cr_{0.1}O_{12}$, $Gd_2Ho_{0.013}Tm_{0.2}Sc_{0.67}Lu_{0.24}Ga_{1.6}Al_{3.2}Cr_{0.08}O_{12}$, and $Gd_{2.67}Ho_{0.01}Tm_{0.17}Sc_{1.8}Lu_{0.3}Ga_2AlCr_{0.05}O_{12}$.

19. An IR emitting device comprising:
a wavelength converting structure, the wavelength converting structure comprising an SWIR phosphor having emission over a wavelength range of 1600-2200 nm with a continuous emission spectrum over a spectral width of at least 500 nm; and
a light source configured to emit into the wavelength converting structure.

20. The IR emitting device of claim 19, wherein the SWIR phosphor comprises $(Gd_{3-u-v-x-y-z}Lu_xTm_yHo_zSc_vRE_u)[Sc_{2-a-b}Lu_aCr_bGa_dAl_e]\{Ga_{3-c}Al_c\}O_{12}$ with RE=La, Y, Yb, Nd, Er, Ce and $0 \le u \le 2$, $0 < v \le 1$, $0 < x \le 1$, $0 < y \le 0.5$, $0 \le z \le 0.05$, $0 < a \le 1$, $0 < b \le 0.3$, $0 \le c \le 3$, $0 < d \le 1.8$, $0 \le e \le 1.8$.

* * * * *